(12) United States Patent
Hirokubo et al.

(10) Patent No.: US 9,891,424 B2
(45) Date of Patent: Feb. 13, 2018

(54) ACTUATOR DRIVE SYSTEM, OPTICAL MODULE, AND ELECTRONIC APPARATUS

(71) Applicant: Seiko Epson Corporation, Tokyo (JP)

(72) Inventors: Nozomu Hirokubo, Fujimi (JP); Akira Sano, Shiojiri (JP)

(73) Assignee: Seiko Epson Corporation (JP)

( * ) Notice: Subject to any disclaimer, the term of this patent is extended or adjusted under 35 U.S.C. 154(b) by 283 days.

(21) Appl. No.: 14/494,996

(22) Filed: Sep. 24, 2014

(65) Prior Publication Data

US 2015/0092275 A1 Apr. 2, 2015

(30) Foreign Application Priority Data

Sep. 27, 2013 (JP) .................................. 2013-201046

(51) Int. Cl.
*G02B 26/00* (2006.01)
*H02N 1/00* (2006.01)
*B81B 7/00* (2006.01)

(52) U.S. Cl.
CPC ............ *G02B 26/001* (2013.01); *B81B 7/008* (2013.01); *H02N 1/006* (2013.01); *B81B 2207/03* (2013.01)

(58) Field of Classification Search
CPC ...... G02B 26/001; G02B 26/007; G02B 5/28; H02N 1/006; H02N 1/002; G01J 3/26; B81B 7/008; B81B 2207/03
See application file for complete search history.

(56) References Cited

U.S. PATENT DOCUMENTS

| | | |
|---|---|---|
| 2004/0061917 A1 | 4/2004 | Mushika et al. |
| 2005/0152019 A1 | 7/2005 | Mushika |
| 2005/0168798 A1 | 8/2005 | Mushika et al. |
| 2007/0064295 A1* | 3/2007 | Faase ................... G02B 26/001 359/245 |
| 2010/0103522 A1* | 4/2010 | Matsumoto ............... G01J 3/26 359/578 |
| 2010/0201291 A1* | 8/2010 | Cheiky ............... F02D 41/2096 318/116 |
| 2011/0222157 A1 | 9/2011 | Sano |
| 2011/0222158 A1 | 9/2011 | Sano |
| 2012/0257205 A1 | 10/2012 | Hirokubo |
| 2013/0279005 A1 | 10/2013 | Sano |
| 2013/0308134 A1 | 11/2013 | Hirokubo |

FOREIGN PATENT DOCUMENTS

| | | |
|---|---|---|
| JP | 02-257676 A | 10/1990 |
| JP | 11-133039 A | 5/1999 |
| JP | 2002-350749 A | 12/2002 |

(Continued)

*Primary Examiner* — Marin Pichler
(74) *Attorney, Agent, or Firm* — Harness, Dickey & Pierce, P.L.C.

(57) ABSTRACT

An actuator drive system includes electrostatic actuators and a voltage controller that applies drive voltages to the electrostatic actuators, and the voltage controller includes a digital control device that splits an 8-bit drive variable corresponding to an overall displacement amount provided by the electrostatic actuators into 4-bit individual drive variables, a first DAC that produces a first drive voltage signal based on a first individual drive variable, and a second DAC that produces a second drive voltage signal based on a second individual drive variable.

11 Claims, 12 Drawing Sheets

(56) References Cited

FOREIGN PATENT DOCUMENTS

| | | |
|---|---|---|
| JP | 2011-191492 A | 9/2011 |
| JP | 2011-191554 A | 9/2011 |
| JP | 2012-220656 A | 11/2012 |
| JP | 2013-072930 A | 4/2013 |
| JP | 2013-088601 A | 5/2013 |
| JP | 2013-218194 A | 10/2013 |
| JP | 2013-222122 A | 10/2013 |
| JP | 2013-238755 A | 11/2013 |
| JP | 2014-059497 A | 4/2014 |
| WO | WO-2003-065103 A1 | 8/2003 |

* cited by examiner

ACTUATOR DRIVE SYSTEM, OPTICAL MODULE, AND ELECTRONIC APPARATUS

BACKGROUND

1. Technical Field

The present invention relates to an actuator drive system, an optical module, and an electronic apparatus.

2. Related Art

There is a known wavelength selective light reception device (wavelength tunable interference filter) including a pair of substrates facing each other, reflection films disposed on the respective substrates and facing each other, and electrodes (actuator) disposed on the respective substrates and facing each other (JP-A-2-257676, for example).

In an optical module including the wavelength tunable interference filter described in JP-A-2-257676 and a voltage controller that applies a drive voltage between the electrodes described above, which face each other, an electrostatic attractive force produced in the space between the electrodes in accordance with the drive voltage applied to the actuator changes the distance between the substrates and hence changes the dimension of a gap created between the reflection films, whereby light of a wavelength according to the dimension of the gap is selectively extracted.

In the wavelength tunable interference filter described in JP-A-2-257676, to precisely set the dimension of the gap corresponding to light of a target wavelength, it is necessary to adjust the drive voltage applied to the actuator in high resolution.

An example of the voltage controller that adjusts the drive voltage applied to the actuator in high resolution inputs a digital signal outputted from a microcomputer or any other digital control device to a drive voltage signal generation device (such as digital to analog converter (DAC) and voltage controlled pulse width modulator (PWM)) and applies an outputted drive voltage signal (drive voltage) to the actuator.

The voltage controller described above can adjust the drive voltage at higher resolution and hence change the displacement amount of the actuator at higher resolution by using a greater number of bits (16 bits, for example) of the digital signal. In this case, in a wavelength tunable interference filter, for example, the dimension of the gap can be precisely controlled to extract light of a target wavelength.

A drive voltage signal generation device capable of processing a digital signal having a greater number of bits is, however, more expensive. There is therefore a problem of an increase in manufacturing cost of the voltage controller.

SUMMARY

An advantage of some aspects of the invention is to provide an actuator drive system capable of precisely controlling a drive voltage and suppressing an increase in manufacturing cost, an optical module, and an electronic apparatus.

An actuator drive system according to an aspect of the invention includes a plurality of actuators that are driven to provide displacement amounts according to drive voltages and a voltage controller that applies the drive voltages to the plurality of actuators, and the voltage controller includes a variable splitter that splits a drive variable having a plurality of digits corresponding to an overall displacement amount provided by the plurality of actuators into individual drive variables having at least one digit and corresponding to the plurality of actuators and signal generators with which the plurality of actuators are provided and which generate drive voltage signals corresponding to the drive voltages based on the individual drive variables.

The phrase "a drive variable corresponding to an overall displacement amount provided by the plurality of actuators" means that the drive variable corresponds to the sum of the displacement amounts provided when the drive voltages are applied to all the actuators.

Further, the split individual drive variables produced by the variable output section may have the same digits or different digits. For example, the 8-bit drive variable may be split into a first individual drive variable having the upper 4 bits and a second individual drive variable having the lower 4 bits or a first individual drive variable having the upper 3 bits and a second individual drive variable having the lower 5 bits.

In the aspect of the invention, the variable output section in the voltage controller splits the drive variable having a plurality of digits into individual drive variables each having predetermined digits. The individual drive variables are related to the drive voltages applied to the plurality of actuators. The plurality of actuators are provided with the signal generators, which generate drive voltage signals based on the individual drive variables set (split) for the actuators. The voltage controller applies drive voltages corresponding to the drive voltage signals to the actuators. It is noted that a configuration in which the drive voltage signals themselves outputted from the signal generators are DC-voltage signals and directly applied to the actuators and a configuration in which the DC-voltage signals are amplified, for example, with amplifiers as appropriate and the amplified voltages are applied to the actuators fall within the scope of the invention. Further, a configuration in which each of the drive voltage signals is a pulse-width-modulated voltage signal is also falls within the scope of the invention. In this case, each of the drive voltages means the average of voltages applied in the form of the modulated voltage signal to the corresponding actuator.

In the configuration described above, the voltage controller splits the drive variable into individual drive variables each having at least one digit and inputs the individual drive variables to the signal generators. The number of digits of each of the individual drive variables to be inputted to the corresponding signal generator is therefore smaller than the number of digits of the drive variable before it is split. As a result, the number of digits that each of the signal generators can process can be reduced as compared with a case where the drive variable is directly inputted to a signal generator, whereby a more inexpensive signal generator can be used. Further, since the number of digits of the drive variable is not changed, no decrease in drive precision occurs even when such an inexpensive signal generator is used. The actuator drive system provided by the aspect of the invention is therefore capable of precisely controlling the drive voltages with an increase in manufacturing cost suppressed.

Further, the number of digits processed by each of the signal generators can be reduced as compared with a case where the drive variable is directly inputted to a signal generator, whereby the processes in the signal generators can be more quickly done and the actuators can be driven at higher speeds accordingly.

In the actuator drive system according to the aspect of the invention described above, it is preferable that the plurality of actuators provide different values of the displacement amount when driven with the drive voltages.

In the configuration described above, the plurality of actuators provide displacement amounts different from each other when a predetermined drive voltage is applied. A combination of a plurality of actuators, for example, a combination of an actuator providing a large displacement amount (for coarse movement) and an actuator providing a small displacement amount (for fine movement), can therefore be used to control the overall displacement amount. The overall displacement amount can therefore be changed not only over a wide range but also in high resolution within the range.

In the actuator drive system according to the aspect of the invention described above, it is preferable that the plurality of individual drive variables are obtained by sequentially dividing the drive variable in a direction from an upper digit toward a lower digit thereof, and that among the plurality of actuators, the actuator that provides a smaller value of the displacement amount when driven with the corresponding drive voltage is related to the individual drive variable having lower digits of the drive variable.

In the configuration described above, the drive variable is so set that an increase in the value thereof results in an increase in the corresponding overall displacement amount, and the individual drive variables are obtained by sequentially dividing the drive variable in the direction from an upper digit toward a lower digit. For example, an 8-bit drive variable is split into a first individual drive variable having the upper 4 bits and a second individual drive variable having the lower 4 bits.

Further, the plurality of individual drive variable and the plurality of actuators are so related to each other that an actuator that provides a smaller displacement amount when the corresponding drive voltage is applied uses lower digits of the drive variable. For example, in the example described above, the second individual drive variable having the lower bits is inputted to a signal converter corresponding to an actuator that provides a small displacement amount.

In the configuration described above, the magnitude of the overall displacement amount provided by the plurality of actuators can be related to the magnitude of the drive variable. As a result, no new drive variable needs to be set, and the drive variable used in related art can be used.

In the actuator drive system according to the aspect of the invention described above, it is preferable that the voltage controller provides the plurality of actuators with the drive voltages corresponding to the individual drive variables but having the same value.

In the configuration described above, when the individual drive variables are equal to one another, the same drive voltage is applied to the plurality of actuators. The plurality of actuators are so configured that they provide displacement amounts differ from one another when the same drive voltage is applied.

In the configuration described above, the voltage controller does not need to output different drive voltages when the individual drive variables are equal to one another. The voltage controller can therefore be so configured that the actuators are provided with the same signal generators and the drive voltage signals are processed in the same manner independently of the related actuators followed by application of the resultant drive voltages. The voltage controller can therefore be designed and manufactured in a simplified manner at a lowered cost.

Further, the actuators only need to be so designed that the sum of the amounts of change provided by the actuators is equal to the amount of change corresponding to the drive variable, whereby the optical module can be readily designed.

In the actuator drive system according to the aspect of the invention described above, it is preferable that each of the actuators is an electrostatic actuator having a pair of drive electrodes facing each other, and that the plurality of actuators have different areas of a facing region of the pair of drive electrodes.

In the configuration described above, each of the actuators is an electrostatic actuator, and the plurality of actuators have different areas of the region where the pair of drive electrodes face each other (hereinafter also referred to as facing areas).

An electrostatic attractive force produced in the space between the pair of drive electrodes of an electrostatic actuator is proportional to the facing area, and the smaller the facing area, the smaller the displacement amount produced by the drive voltage, whereas the greater the facing area, the greater the displacement amount produced by the drive voltage.

In the configuration described above, appropriately setting the facing areas of the plurality of electrostatic actuators allows the dimension of the gap between the drive electrodes to change by the amount of change related to the drive variable. The optical module can therefore be more readily designed.

In the actuator drive system according to the aspect of the invention described above, it is preferable that among the plurality of actuators, in two actuators that provide closest values of the displacement amount when driven with the corresponding drive voltages, the displacement amount provided by one of the two actuators when the corresponding individual drive variable is changed by one step is the sum of the displacement amount provided by the other actuator when the corresponding individual drive variable is changed by one step and the displacement amount provided by the other actuator when a maximum drive voltage is applied.

In the configuration described above, in two actuators that provide closest displacement amounts corresponding to one step of the individual drive variables associated with the two actuators, a displacement amount $D_1$ corresponding to one step associated with the actuator that provides the greater displacement amount is equal to or substantially equal to the sum of the amount of change $d_1$ corresponding to one step associated with the actuator that provides the smaller displacement amount and a displacement amount $d_M$ provided when a maximum drive voltage is applied to the actuator. Among the plurality of actuators, the relationship described above is satisfied between two actuators that provide closest displacement amounts corresponding to one step of the individual drive variables associated with the two actuators.

In the configuration described above, when each of the signal generators can change the drive voltage from a minimum output voltage to a maximum output voltage in n steps, the displacement amount corresponding to one step associated with the actuator that provides the greater displacement amount can be split into n displacement amounts each of which is equal to the amount of change in the displacement amount corresponding to one step associated with the actuator that provides the smaller displacement amount. Therefore, across the entire range of the overall displacement amount from 0 to the maximum value, there is no section where the interval between settable overall displacement amounts is large or no section where the interval is small. The overall displacement amount can therefore be set in a substantially uniform manner across the entire range for precise drive control.

In the actuator drive system according to the aspect of the invention described above, it is preferable that each of the signal generators is a digital-analog converter.

In the configuration described above, a digital-analog converter (DAC) is used as each of the signal generators.

Since a DAC has a simple configuration, the voltage controller can be readily designed. Further, since a DAC is a relatively inexpensive signal generator, the voltage controller can be manufactured at a lowered cost. Moreover, since a DAC produces a DC voltage, high-frequency noise will not be produced, whereby the voltage controller can precisely control the drive voltages.

In the actuator drive system according to the aspect of the invention described above, it is preferable that each of the signal generators is a pulse width modulator that performs pulse width modulation on a fixed voltage to generate the corresponding drive voltage signal.

In the configuration described above, a pulse width modulator (PWM) is used as each of the signal generators.

When PWMs are used, the number of digits of a timer circuit provided in each of the PWMs can be reduced, whereby an inexpensive PWM can be used.

Further, when an amplifier that amplifies a drive voltage signal outputted from each of the PWMs is provided, the amplifier can be a class-D amplifier (digital amplifier). A class-D amplifier has high amplification efficiency and can be compact, whereby the drive efficiency of the voltage controller can be improved and the size thereof can be reduced.

In the actuator drive system according to the aspect of the invention described above, it is preferable that the actuator drive system further includes a displacement amount detector that detects the overall displacement amount, and the voltage controller preferably controls the drive voltages based on a detection result of the overall displacement amount from the displacement amount detector.

In the configuration described above, the voltage controller controls the drive voltages based on the overall displacement amount detected with the displacement amount detector.

In the configuration described above, in which the voltage controller performs feedback control of the drive voltages based on the detected overall displacement amount, the overall displacement amount can be precisely controlled.

In the actuator drive system according to the aspect of the invention described above, it is preferable that the displacement amount detector includes a pair of capacitance detection electrodes facing each other and detects electrostatic capacitance between the capacitance detection electrodes.

In the configuration described above, the displacement amount detector detects electrostatic capacitance between the pair of capacitance detection electrodes.

In the configuration described above, the capacitance detection electrodes that form the displacement amount detector can be thin, whereby the size of the drive system can be reduced.

An optical module according to another aspect of the invention includes a pair of reflection films facing each other, a plurality of actuators that are driven to provide displacement amounts according to drive voltages to change the dimension of a gap between the pair of reflection films, and a voltage controller that applies the drive voltages to the plurality of actuators, and the voltage controller includes a variable splitter that splits a drive variable having a plurality of digits corresponding to an overall displacement amount provided by the plurality of actuators into individual drive variables having at least one digit and corresponding to the plurality of actuators and signal generators with which the plurality of actuators are provided and which generate drive voltage signals corresponding to the drive voltages based on the individual drive variables.

The phrase "a drive variable corresponding to an overall displacement amount provided by the plurality of actuators" means that the drive variable corresponds to the sum of the displacement amounts (amounts of change in gap dimension) provided when the drive voltages are applied to all the actuators, and the phrase also includes a situation in which the drive variable corresponds to a final gap dimension (target value) after the amount of change described above is made or a situation in which the drive variable corresponds to the wavelength of light (target wavelength) extracted by a wavelength tunable interference filter when the gap dimension reaches the target value.

In the aspect of the invention, the voltage controller splits the drive variable having a plurality of digits into individual drive variables each having a predetermined number of digits and applies drive voltages based on the individual drive variables to the corresponding actuators, as in the aspect of the invention described above.

In the configuration, the optical module provided by the aspect of the invention is capable of precisely controlling the drive voltages with an increase in manufacturing cost suppressed, as described above.

An electronic apparatus according to still another aspect of the invention includes a wavelength tunable interference filter having a pair of reflection films facing each other and a plurality of actuators that are driven to provide displacement amounts according to drive voltages to change the dimension of a gap between the pair of reflection films; a voltage controller that applies the drive voltages to the plurality of actuators; and a drive controller that causes the voltage controller to apply the drive voltages, and the voltage controller includes a variable splitter that splits a drive variable having a plurality of digits corresponding to an overall displacement amount provided by the plurality of actuators into individual drive variables having at least one digit and corresponding to the plurality of actuators and signal generators with which the plurality of actuators are provided and which generate drive voltage signals corresponding to the drive voltages based on the individual drive variables.

In the aspect of the invention, the voltage controller splits the drive variable having a plurality of digits into individual drive variables each having a predetermined number of digits and applies drive voltages based on the individual drive variables to the corresponding actuators, as in the aspect of the invention described above.

In the configuration described above, the electronic apparatus provided by the aspect of the invention is capable of precisely controlling the drive voltages with an increase in manufacturing cost suppressed, as described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

A first embodiment according to the invention will be described below with reference to the drawings.
Configuration of Spectroscopic Measurement Apparatus FIG. 1 is a block diagram showing a schematic configuration of a spectroscopic measurement apparatus of a first embodiment according to the invention.

A spectroscopic measurement apparatus 1, which is an electronic apparatus according to an embodiment of the invention, is an apparatus that analyzes the optical intensity at each predetermined wavelength of light under measurement reflected off an object X under measurement to provide an optical spectrum. In the present embodiment, the light under measurement reflected off the object X under measurement is measured by way of example, whereas when the object X under measurement is a light emitting object, such as a liquid crystal panel, light emitted from the light emitting object may be the light under measurement.

Figure 1:
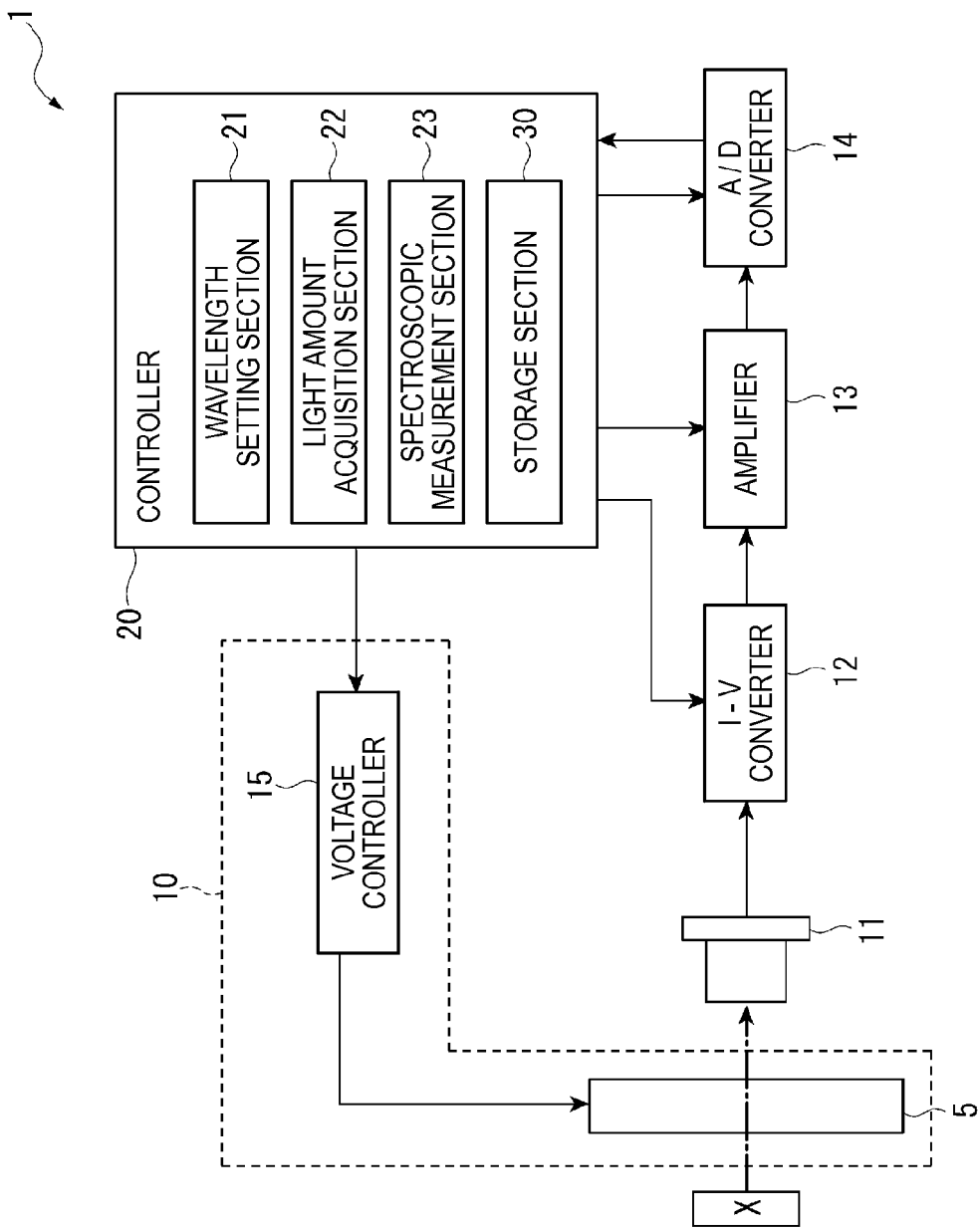
FIG. 1 is a block diagram showing a schematic configuration of a spectroscopic measurement apparatus of a first embodiment according to the invention.

The spectroscopic measurement apparatus 1 includes an optical module 10, a detector 11 (detection section), an I-V converter 12, an amplifier 13, an A/D converter 14, and a controller 20, as shown in FIG. 1. The optical module 10 includes a wavelength tunable interference filter 5 and a voltage controller 15.

The detector 11 receives light having passed through the wavelength tunable interference filter 5 in the optical module 10 and outputs a detection signal (current) according to the optical intensity of the received light.

The I-V converter 12 converts the detection signal inputted from the detector 11 into a voltage value and outputs the voltage value to the amplifier 13.

The amplifier 13 amplifies the voltage according to the detection signal (detected voltage) inputted from the I-V converter 12.

The A/D converter 14 converts the detected voltage (analog signal) inputted from the amplifier 13 into a digital signal and outputs the digital signal to the controller 20.

The voltage controller 15 drives the wavelength tunable interference filter 5 to cause the wavelength tunable interference filter 5 to transmit light of a predetermined target wavelength under the control of the controller 20.
Configuration of Optical Module
Configuration of Wavelength Tunable Interference Filter The wavelength tunable interference filter 5 in the optical module 10 will be described below.

Figure 2:
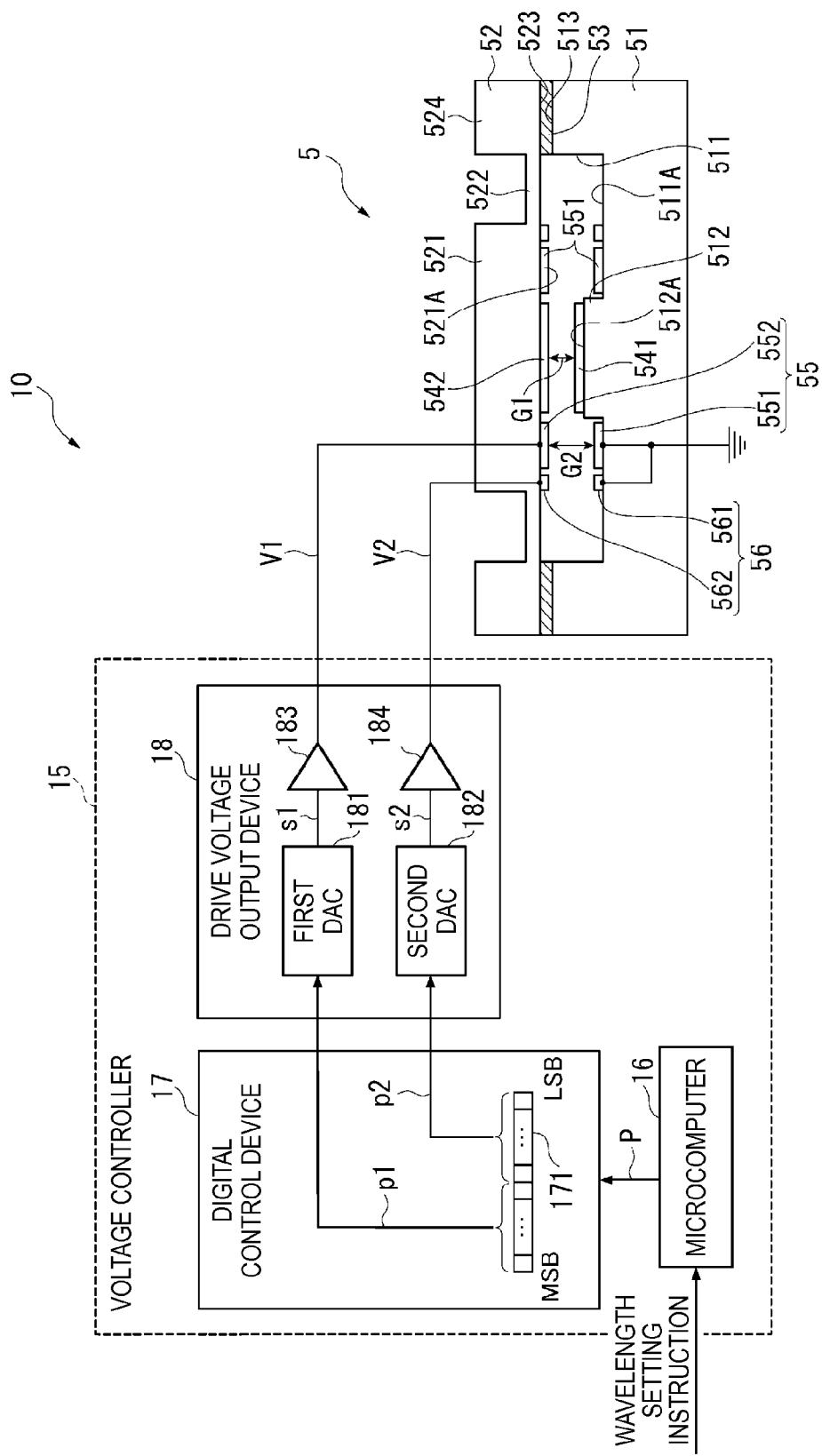
FIG. 2 shows a schematic configuration of an optical module of the embodiment described above.

The wavelength tunable interference filter 5 is an optical member having a rectangular-plate-like shape or any other suitable shape and includes a fixed substrate 51 (first substrate), a movable substrate 52 (second substrate), a pair of reflection films 541 and 542, a first electrostatic actuator 55, and a second electrostatic actuator 56, as shown in FIG. 2.

The wavelength tunable interference filter 5, in which the voltage controller 15 applies drive voltages to the electrostatic actuators 55 and 56, can control the dimension of a gap G1 between the pair of reflection films 541 and 542 to extract light of a wavelength according to the dimension of the gap G1 as interference light.

An actuator drive system according to the embodiment of the invention at least includes the electrostatic actuators 55 and 56 and the voltage controller 15.

In the wavelength tunable interference filter 5, each of the fixed substrate 51 and the movable substrate 52 is made, for example, a glass material among a variety of types thereof or quartz. A first bonding portion 513 of the fixed substrate 51 and a second bonding portion 523 of the movable substrate 52 are bonded to each other via a bonding film 53 formed, for example, of a plasma polymerization film primarily made, for example, of siloxane so that the fixed substrate 51 and the movable substrate 52 form an integrated unit.

The fixed reflection film 541 is provided on the fixed substrate 51, and the movable reflection film 542 is provided on the movable substrate 52. The fixed reflection film 541 and the movable reflection film 542 correspond to a pair of reflection films according to an embodiment of the invention and are so disposed that they face each other via an inter-reflection-film gap G1. The size of the inter-reflection-film gap G1 corresponds to the distance between the surfaces of the fixed reflection film 541 and the movable reflection film 542.
Configuration of Fixed Substrate The fixed substrate 51 has an electrode placement groove 511 and a reflection film attachment portion 512 formed therein, for example, in an etching process, as shown in FIG. 2.

The electrode placement groove 511 is provided in a portion excluding an outer circumferential portion of the fixed substrate 51 in a filter plan view. The groove bottom surface of the electrode placement groove 511 forms an electrode attachment surface 511A, on which electrodes that form the electrostatic actuators 55 and 56 are disposed.

A first fixed electrode 551, which forms the first electrostatic actuator 55, and a second fixed electrode 561, which forms the second electrostatic actuator 56, are disposed on the electrode attachment surface 511A. The first fixed electrode 551 is disposed outside the reflection film attachment portion 512 but inside the second fixed electrode 561.

Although not shown in FIG. 2, the fixed substrate 51 has an electrode drawing groove provided therein, and the electrode drawing groove is flush with and extends from the electrode placement groove 511 toward an outer circumferential portion of the substrate. Each of the first fixed electrode 551 and the second fixed electrode 561 includes a connection electrode disposed in the electrode placement groove 511 and the electrode drawing groove and exposed out of the outer circumference of the substrate. The exposed portion of each of the connection electrodes is grounded.

The reflection film attachment portion 512 is so formed that it protrudes from a central portion of the electrode placement groove 511 toward the movable substrate 52. The front end surface of the thus protruding reflection film attachment portion 512 forms a reflection film attachment surface 512A, on which the fixed reflection film 541 is disposed.

The fixed reflection film 541 can be formed, for example, of a metal film made, for example, of Ag, or an alloy film made of an Ag alloy or any other electrically conductive alloy. The fixed reflection film 541 may instead be formed, for example, of a dielectric multilayer film formed of a high refractive layer made of $TiO_2$ and a low refractive layer made of $SiO_2$. In this case, the lowest layer or a surface layer of the dielectric multilayer film is preferably formed of an electrically conductive metal alloy film.

An antireflection film may be formed on a light incident surface of the fixed substrate 51 (surface on which fixed reflection film 541 is not provided) in a position corresponding to the fixed reflection film 541. The antireflection film can be formed by alternately layering a low refractive index film and a high refractive index film on each other, and the thus formed antireflection film decreases visible light reflectance of the surface of the fixed substrate 51 whereas increasing visible light transmittance thereof.

Part of the surface of the fixed substrate 51 that faces the movable substrate 52, specifically, the surface where the electrode placement groove 511 or the reflection film attachment portion 512 is not formed forms the first bonding portion 513. The first bonding portion 513 is bonded to the second bonding portion 523 of the movable substrate 52 via the bonding film 53.

Configuration of Movable Substrate

The movable substrate 52 has a movable portion 521, which has, for example, a circular shape and is disposed in a central portion of the movable substrate 52, a holding portion 522, which holds the movable portion 521, and a substrate outer circumferential portion 524, which is provided in a region outside the holding portion 522.

The movable portion 521 is formed to be thicker than the holding portion 522. In the present embodiment, for example, the movable portion 521 is formed to be as thick as the movable substrate 52. The movable portion 521 has a movable surface 521A, which faces the fixed substrate 51, and the movable reflection film 542, a first movable electrode 552, and a second movable electrode 562 are provided on the movable surface 521A.

An antireflection film may be formed on the surface of the movable portion 521 that faces away from the fixed substrate 51, as in the case of the fixed substrate 51.

The movable reflection film 542 is so disposed on a central portion of the movable surface 521A of the movable portion 521 that the movable reflection film 542 faces the fixed reflection film 541 via the inter-reflection-film gap G1. The movable reflection film 542 has the same configuration as that of the fixed reflection film 541 described above.

The first movable electrode 552, which forms the first electrostatic actuator 55, and the second movable electrode 562, which forms the second electrostatic actuator 56, are disposed on the movable surface 521A. The first movable electrode 552 is disposed outside the movable reflection film 542 but inside the second movable electrode 562.

The first movable electrode 552 and the second movable electrode 562 are so disposed in a plan view viewed in the thickness direction of the substrates that the first movable electrode 552 and the second movable electrode 562 face the first fixed electrode 551 and the second fixed electrode 561 respectively via an inter-electrode gap G2.

The first electrostatic actuator 55 includes the first fixed electrode 551 and the first movable electrode 552. The second electrostatic actuator 56 includes the second fixed electrode 561 and the second movable electrode 562. Each of the electrostatic actuators 55 and 56 will be described later in detail.

Although not shown in FIG. 2, each of the first movable electrode 552 and the second movable electrode 562 includes a connection electrode extending from part of the outer circumferential edge thereof, disposed along a portion facing the above-mentioned electrode drawing groove formed in the fixed substrate 51, and disposed at an outer circumferential portion of the second substrate 52 and exposed out thereof. The exposed portion of the connection electrode is connected to the voltage controller 15, for example, via an FPC (flexible printed circuit) or a lead wire.

The holding portion 522 is a diaphragm that surrounds the movable portion 521 and is formed to be thinner than the movable portion 521. The thus configured holding portion 522 is more readily bent than the movable portion 521 and can therefore displace the movable portion 521 toward the fixed substrate 51 under a small magnitude of electrostatic attractive force. In the present embodiment, the diaphragm-shaped holding portion 522 is presented by way of example, but the holding portion 522 is not necessarily formed of a diaphragm. For example, beam-shaped holding portions disposed at equal angular intervals may be provided around a filter center point O.

The substrate outer circumferential portion 524 is disposed in the region outside the holding portion 522 in the filter plan view, as described above. The surface of the substrate outer circumferential portion 524 that faces the fixed substrate 51 forms the second bonding portion 523, which faces the first bonding portion 513 and is bonded to the first bonding portion 513 via the bonding film 53.

Configuration of Voltage Controller

The voltage controller 15 includes a microcomputer 16, a digital control device 17, and a drive voltage output device 18, as shown in FIG. 2.

The microcomputer 16 acquires a drive variable P as a wavelength setting instruction from the controller 20, which will be described later, and outputs the drive variable P as a control signal for driving the electrostatic actuators 55 and 56 to the digital control device 17. The microcomputer 16 controls operation of each of the devices of the voltage controller 15 as well as the operation described above.

The drive variable P is a digital signal formed of a plurality of bits and corresponds to the amount of change in the dimension of the inter-reflection-film gap G1 for changing an initial dimension of the inter-reflection-film gap G1 to the dimension thereof corresponding to a target wavelength, that is, corresponds to an overall displacement amount of the electrostatic actuators 55 and 56.

The digital control device 17 corresponds to the variable output device according to an embodiment of the invention, splits the drive variable P outputted from the microcomputer 16 into individual drive variables (corresponding to individual drive variables according to an embodiment of the invention), and outputs each of the individual drive variables to the drive voltage output device 18.

Specifically, the digital control device 17 includes a storage section 171, which stores the drive variable P. In the following description, the drive variable P will be described as 8-bit digital information by way of example.

The digital control device 17 sequentially stores the value at each digit of the drive variable P, which is an 8-bit signal, from the most significant bit (MSB) to the least significant bit (LSB) in the storage section 171.

The digital control device 17 splits the drive variable P stored in the storage section 171 into two sets of bits, upper 4 bits and lower 4 bits, and outputs a first individual drive variable p1 corresponding to the upper 4 bits and a second individual drive variable p2 corresponding to the lower 4 bits to the drive voltage output device 18.

The drive voltage output device 18 applies voltages to the electrostatic actuators 55 and 56 based on the individual drive variables p1 and p2 from the digital control device 17. The drive voltage output device 18 includes a first DAC 181, a second DAC 182, and amplifiers 183 and 184 connected to the DACs 181 and 182 respectively.

The first DAC 181 corresponds to the signal generator according to an embodiment of the invention that is associated with the first electrostatic actuator 55, and the second DAC 182 corresponds to the signal generator according to an embodiment of the invention that is associated with the second electrostatic actuator 56.

In the present embodiment, the first DAC 181 and the second DAC 182 are configured in the same manner except that individual drive variables inputted thereto differ from each other. The amplifiers 183 and 184 are configured in the same manner, for example, in terms of amplification factor except that input sources and output destinations associated with the two amplifiers differ from each other. That is, the drive voltage output device 18 outputs drive voltages of the same magnitude when the individual drive variables p1 and p2 are equal to each other.

The first DAC 181 converts the first individual drive variable p1 from the digital control device 17 into an analog signal and outputs the analog signal as a first drive voltage signal s1 to the amplifier 183. That is, the first DAC 181 is capable of converting a 4-bit digital signal into an analog signal.

The amplifier 183 amplifies the voltage value of the first drive voltage signal s1 from the first DAC 181 and applies the amplified voltage as a first drive voltage V1 to the first movable electrode 552, that is, the first electrostatic actuator 55.

The second DAC 182 converts the second individual drive variable p2 from the digital control device 17 into an analog signal and outputs the analog signal as a second drive voltage signal s2 to the amplifier 184.

The amplifier 184 amplifies the voltage value of the second drive voltage signal s2 from the second DAC 182 and applies the amplified voltage as a second drive voltage V2 to the second movable electrode 562, that is, the second electrostatic actuator 56.

Specific Example of Drive Variable

Figure 3:
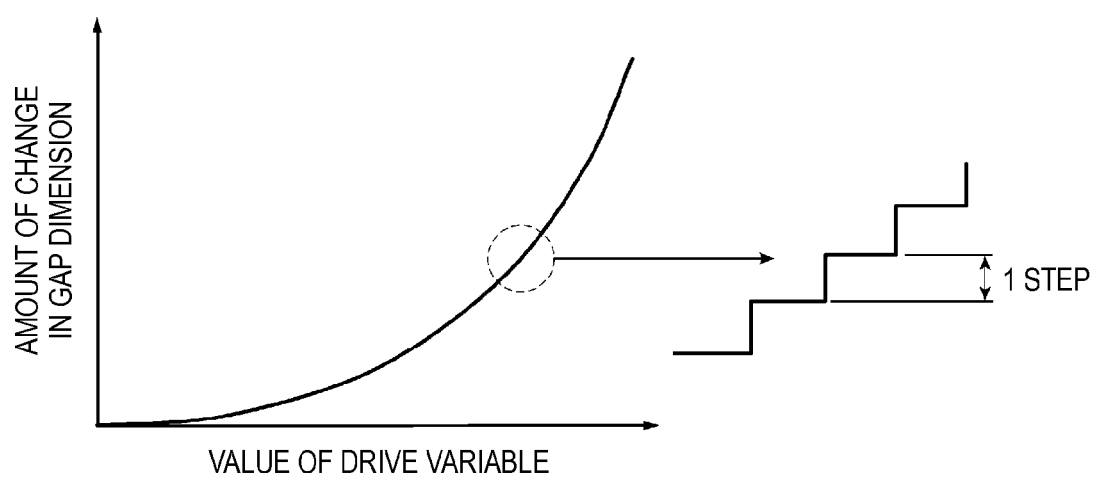
FIG. 3 is a graph showing an example of the relationship between a drive variable and the amount of change in the dimension of an inter-reflection-film gap.

FIG. 3 is a graph diagrammatically showing an example of the relationship between the drive variable P and how much the dimension of the gap G1 changes with the drive variable P, that is, between the drive variable P and the overall displacement amount provided by the electrostatic actuators 55 and 56.

In the present embodiment, the drive variable P is so set that the electrostatic attractive force produced by the electrostatic actuators 55 and 56 increases and hence the amount of change in the position (overall displacement amount) of the movable portion 521 increases as the value of the drive variable P increases, as shown in FIG. 3. When the drive variable P is an 8-bit value, the voltage controller 15 can change the amount of change described above stepwise in 256 steps. That is, when the drive variable P is incremented by one, the amount of change increases by one step.

Drive Voltage Control Performed by Voltage Controller

Figure 4:
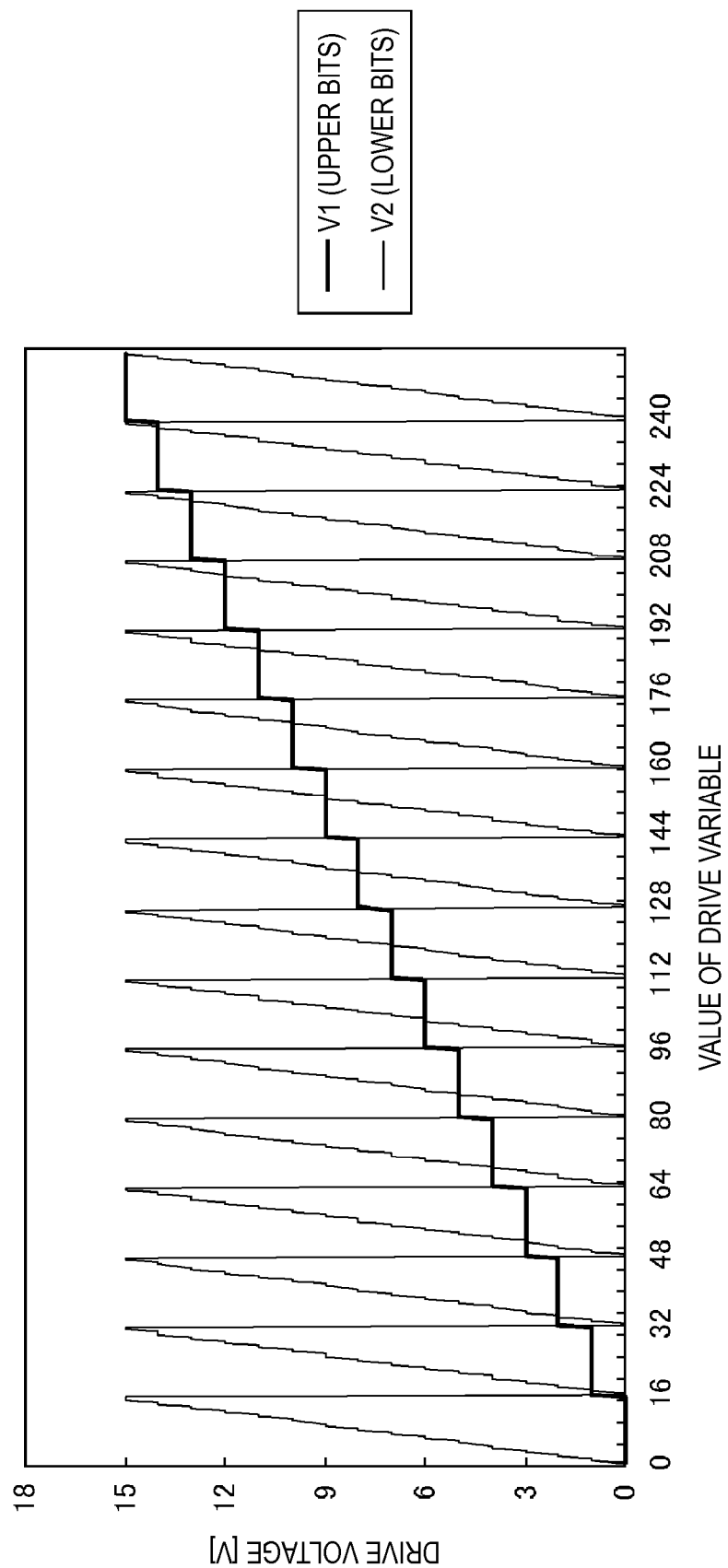
FIG. 4 is a graph showing an example of the relationship between the value of the drive variable and drive voltages.

FIG. 4 is a graph showing an example of the relationship of the value of the drive variable P with the first drive voltage V1 applied to the first electrostatic actuator 55 and the second drive voltage V2 applied to the second electrostatic actuator 56.

Within the range of the drive variable P from 0 to 15 (decimal number), only the second individual drive variable p2 (lower 4 bits) is changed, whereas the first individual drive variable p1 (upper 4 bits) is not changed, as shown in FIG. 4. Therefore, the first drive voltage V1 is not changed but remains at 0 V, but the second drive voltage V2 is changed stepwise between 0 V and 15 V.

When the drive variable P is 16, the value of the first individual drive variable p1 (upper 4 bits) is 1, and the second individual drive variable p2 is 0. The first drive voltage V1 is 1 V corresponding to one step of the drive voltage, and the second drive voltage V2 is 0 V.

Within the range of the drive variable P from 16 to 31, only the second individual drive variable p2 (lower 4 bits) is changed. Therefore, the first drive voltage V1 is not changed but remains at 1 V, but the second drive voltage V2 is changed stepwise between 0 V and 15 V.

As described above, whenever the drive variable P increases by 16, the first drive voltage V1 increases by 1 V corresponding to one step, and the second drive voltage V2 is changed stepwise between 0 V, which is the minimum voltage, to 15 V, which is the maximum voltage. When the drive variable P is 255, each of the first individual drive variable p1 and the second individual drive variable p2 becomes 16, which is the maximum value, and each of the first drive voltage V1 and the second drive voltage V2 becomes 15 V, which is the maximum voltage.

As described above, in the present embodiment, dividing the 8-bit drive variable P into the first individual drive variable p1, which is formed of the upper 4 bits, and the second individual drive variable p2, which is formed of the lower 4 bits, allows the 256-step drive control.

Configuration of Electrostatic Actuator

The first electrostatic actuator 55 corresponds to one of the actuators according to an embodiment of the invention and includes the first fixed electrode 551 and the first movable electrode 552, which are so disposed that they face each other via the inter-electrode gap G2.

Similarly, the second electrostatic actuator 56 corresponds to the other actuator according to the embodiment of the invention and includes the second fixed electrode 561 and the second movable electrode 562, which are so disposed that they face each other via the inter-electrode gap G2. The size of the inter-electrode gap G2 corresponds to the distance between the surfaces of the electrodes that face each other.

Now, let S1 be the area of the region where the electrodes 551 and 552 of the first electrostatic actuator 55 face each other (the area of the region where the electrodes of each of the electrostatic actuators face each other is hereinafter also referred to as a facing area), and S2 be the facing area of the second electrostatic actuator 56.

The facing areas S1 and S2 of the electrostatic actuators 55 and 56 satisfy S1>S2. In each of the electrostatic actuators, the magnitude of a produced electrostatic attractive force is proportional to the facing area. The electrostatic attractive force produced by the first electrostatic actuator 55 is therefore greater than the electrostatic attractive force produced by the second electrostatic actuator 56 when a predetermined drive voltage is applied to the electrostatic actuators, whereby the displacement amount of the first electrostatic actuator 55 is greater than the displacement amount of the second electrostatic actuator 56 when the predetermined drive voltage is applied to the electrostatic actuators. In the present embodiment, the first electrostatic actuator 55 is used as a coarse movement actuator, and the second electrostatic actuator 56 is used as a fine movement actuator.

In the first electrostatic actuator 55, let $d_1$ be the displacement amount corresponding to one step of the first individual drive variable p1 (amount of change in the dimension of the inter-reflection-film gap G1). Further, in the second electrostatic actuator 56, let $d_2$ be the displacement amount corresponding to one step of the second individual drive variable p2, and $d_{2M}$ be the displacement amount provided when the maximum value of the second drive voltage V2 (15 V in the present embodiment) is applied. The thus defined displacement amounts satisfy the following relationship: $d_1$ is equal to or substantially equal to $d_2+d_{2M}$.

In the present embodiment, the facing areas S1 and S2 of the electrostatic actuators 55 and 56 are so set in accordance with the amplification factors of the amplifiers 183 and 184 that the displacement amounts (amounts of change in dimension of inter-reflection-film gap G1) satisfy the relationship described above when the drive voltages change by a certain amount and the overall displacement amount is related to the value of the drive variable P.

When the first drive voltage V1 corresponding to the first individual drive variable p1 is applied to the thus configured first electrostatic actuator 55 and the second drive voltage V2 corresponding to the second individual drive variable p2 is applied to the thus configured second electrostatic actuator 56, the resultant electrostatic attractive force deforms the diaphragm portion of the movable substrate 52 toward the fixed substrate 51, and the dimension of the inter-reflection-film gap G1 changes by the overall displacement amount corresponding to the drive variable P. The wavelength tunable interference filter 5 can then extract light of a wavelength according to the dimension of the changed inter-reflection-film gap G1.

Configuration of Controller

Referring back to FIG. 1, the controller 20 in the spectroscopic measurement apparatus 1 will be described.

The controller 20, which corresponds to the processor according to an embodiment of the invention, is, for example, a combination of a CPU, a memory, and other components and controls the overall action of the spectroscopic measurement apparatus 1. The controller 20 includes a wavelength setting section 21, a light amount acquisition section 22, and a spectroscopic measurement section 23, as shown in FIG. 1.

The controller 20 further includes a storage section 30, which stores a variety of data. The storage section 30 specifically stores the drive variable P, according to which the electrostatic actuators 55 and 56 are controlled, and a variety of other data necessary for the control of the spectroscopic measurement apparatus 1.

The wavelength setting section 21 acquires a drive variable P corresponding to a target wavelength from the storage section 30 and outputs the drive variable P as the wavelength setting instruction to the voltage controller 15.

The light amount acquisition section 22 acquires the amount of light of the target wavelength having passed through the wavelength tunable interference filter 5 based on the amount of light acquired with the detector 11.

The spectroscopic measurement section 23 measures spectral characteristics of the light under measurement based on the amount of light acquired by the light amount acquisition section 22.

Advantageous Effects of First Embodiment

In the present embodiment, the digital control device 17 in the voltage controller 15 splits the drive variable P into the two individual drive variables p1 and p2. The first individual drive variable p1 is related to the first drive voltage V1 applied to the first electrostatic actuator 55, and the second individual drive variable p2 is related to the second drive voltage V2 applied to the second electrostatic actuator 56. In the drive voltage output device 18, the first DAC 181 is provided for the first electrostatic actuator 55 and the second DAC 182 is provided for the second electrostatic actuator 56, and the first individual drive variable p1 is inputted to the first DAC 181 and the second individual drive variable p2 is inputted to the second DAC 182. In the drive voltage output device 18, the drive voltages signals s1 and s2 are produced by the DACs 181 and 182 based on the individual drive variables p1 and p2 and amplified by the amplifiers 183 and 184, and the resultant drive voltages V1 and V2 are applied to the electrostatic actuators 55 and 56, respectively. When the drive voltages V1 and V2 are applied to the electrostatic actuators 55 and 56, the dimension of the inter-reflection-film gap G1 is changed. The wavelength tunable interference filter 5 can then extract light of a wavelength according to the dimension of the changed inter-reflection-film gap G1.

In the configuration described above, the voltage controller 15 splits the drive variable P, which corresponds to the overall displacement amount for achieving a target wavelength, that is, a desired dimension of the inter-reflection-film gap G1, on a bit-digit basis and inputs the split individual drive variables p1 and p2 to the DACs 181 and 182, respectively. The number of digits of each of the individual drive variables p1 and p2 (4 bits) inputted to the DACs 181 and 182 can therefore be smaller than the number of digits of the drive variable P (8 bits) before it is split. As a result, the number of digits of a digital signal that each of the DACs can process can be reduced as compared with a case where the drive variable P is directly inputted to a DAC, whereby a more inexpensive DAC can be used. For example, when the drive variable P is a 16-bit value, a related art configuration needs to employ a DAC capable of processing a 16-bit drive variable. In contrast, in the present embodiment, for example, employing two DACs each capable of processing an 8-bit individual drive variable allows 16-bit-equivalent drive control. In this case, since the number of digits of the drive variable is not reduced, no decrease in drive precision occurs.

A DAC capable of processing a digital signal having a smaller number of digits (8 bits, for example) is typically less expensive than a DAC capable of processing a digital signal having a greater number of digits (16 bits, for example). Further, an inexpensive single-chip microcomputer with a plurality of 8-bit processable DACs built therein is commonly manufactured. Therefore, the optical module 10 can precisely control the drive voltages by using the drive variable P having a large number of bits, and the optical module 10 can be manufactured at a lowered cost.

Further, the number of digits of a digital signal processed by each of the DACs can be reduced in the case where the individual drive variables p1 and p2 are inputted to the DACs as compared with a case where the drive variable P having a large number of digits is directly inputted to a DAC, whereby the processes in the DACs can be more quickly done and the actuators can be driven at higher speeds accordingly.

Moreover, the spectroscopic measurement apparatus 1, which includes the optical module 10 described above, can perform spectroscopic measurement at high speed with high precision with the manufacturing cost lowered.

In the present embodiment, the first electrostatic actuator 55 is used as a coarse movement actuator, and the second electrostatic actuator 56 is used as a fine movement actuator. The electrostatic actuators 55 and 56 provide displacement amounts (amounts of change in the dimension of the inter-reflection-film gap G1) different from each other when the individual drive variables p1 and p2 change by one step.

In the configuration described above, the combination of the electrostatic actuators 55 and 56 can be used to control the dimension of the inter-reflection-film gap G1 in such a way that the dimension of the inter-reflection-film gap G1 can be changed not only over a wide range but also in high resolution within the range.

In the present embodiment, the magnitude of the drive variable P corresponds to the magnitude of the overall displacement amount (amount of change in the dimension of the inter-reflection-film gap G1), and the drive variable P is so split that the upper bits thereof form the individual drive variable p1 and the lower bits thereof form the individual drive variable p2. The upper-bit individual drive variable p1 is related to the first electrostatic actuator 55 for coarse movement with a large displacement amount, and the lower-bit individual drive variable p2 is related to the second electrostatic actuator 56 for fine movement with a small displacement amount.

In the configuration described above, the magnitude of the overall displacement amount provided by the electrostatic actuators 55 and 56 can be related to the magnitude of the drive variable P. As a result, no new drive variable P needs to be set, and the drive variable P used in related art can be used.

In the present embodiment, the DACs 181 and 182 have the same configuration, and the amplifiers 183 and 184 also have the same configuration. That is, when the individual drive variables p1 and p2 are equal to each other, the same drive voltage is applied to the electrostatic actuators 55 and 56. Since the facing areas of the electrostatic actuators 55 and 56 differ from each other, the same drive voltage results in different amounts of change in the displacement amount.

In the configuration described above, since the facing areas of the electrostatic actuators 55 and 56 differ from each other, different amounts of change in the displacement amount are provided even when the individual drive variables p1 and p2 are equal to each other. Therefore, to cause the amounts of change in the electrostatic actuators 55 and 56 to differ from each other when the individual drive variables p1 and p2 are inputted, the electrostatic actuators 55 and 56 do not need to be provided with amplifiers having different amplification factors or DACs that produce different drive voltage signals but can be provided with the same DACs and amplifiers. As a result, the voltage controller 15 can be designed and manufactured in a simplified manner at a lowered cost.

Further, in each of the electrostatic actuators 55 and 56, the electrostatic attractive force produced in the space between the pair of electrodes is proportional to the facing area. Therefore, in the configuration of the present embodiment, in which electrostatic actuators are used to control the dimension of the inter-reflection-film gap G1, the facing areas of the electrostatic actuators 55 and 56 only need be so designed that the overall displacement amount provided by the electrostatic actuators 55 and 56 corresponds to the drive variable P, whereby the optical module 10 can be readily designed.

In the present embodiment, the displacement amount $d_1$ corresponding to one step of the first individual drive variable p1 in the first electrostatic actuator 55 is equal to or substantially equal to the sum of the displacement amount $d_2$ corresponding to one step of the second individual drive variable p2 in the second electrostatic actuator 56 and the displacement amount $d_{2M}$ provided when the maximum value of the second drive voltage V2 is applied to the second electrostatic actuator 56.

In the configuration described above, across the entire range of the overall displacement amount changing from 0 to the maximum value, there is no section where the interval between possible overall displacement amounts is large or no section where the interval is small, that is, there is no unevenness in the interval between overall displacement amounts. As a result, the overall displacement amount can be precisely controlled across the entire range of the overall displacement amount, and hence the dimension of the inter-reflection-film gap G1 can be precisely controlled.

In the present embodiment, DACs are used to convert the individual drive variables p1 and p2 into the drive voltage signals s1 and s2.

When DACs are used as described above, each of the DACs has a simpler configuration as a signal generator capable of generating a drive voltage signal than, for example, a pulse width modulator, whereby the voltage controller 15 can be readily designed. Further, since a DAC is a relatively inexpensive signal generation device, the voltage controller 15 can be manufactured at a lowered cost. Moreover, since a DAC produces a DC voltage, high-frequency noise will not be produced, whereby the voltage controller 15 can precisely control the drive voltages.

Second Embodiment

A second embodiment according to the invention will next be described with reference to the drawings.

The present embodiment differs from the first embodiment in that each of the DACs as the signal generation device is replaced with a voltage-controlled pulse width modulator (PWM).

Figure 5:
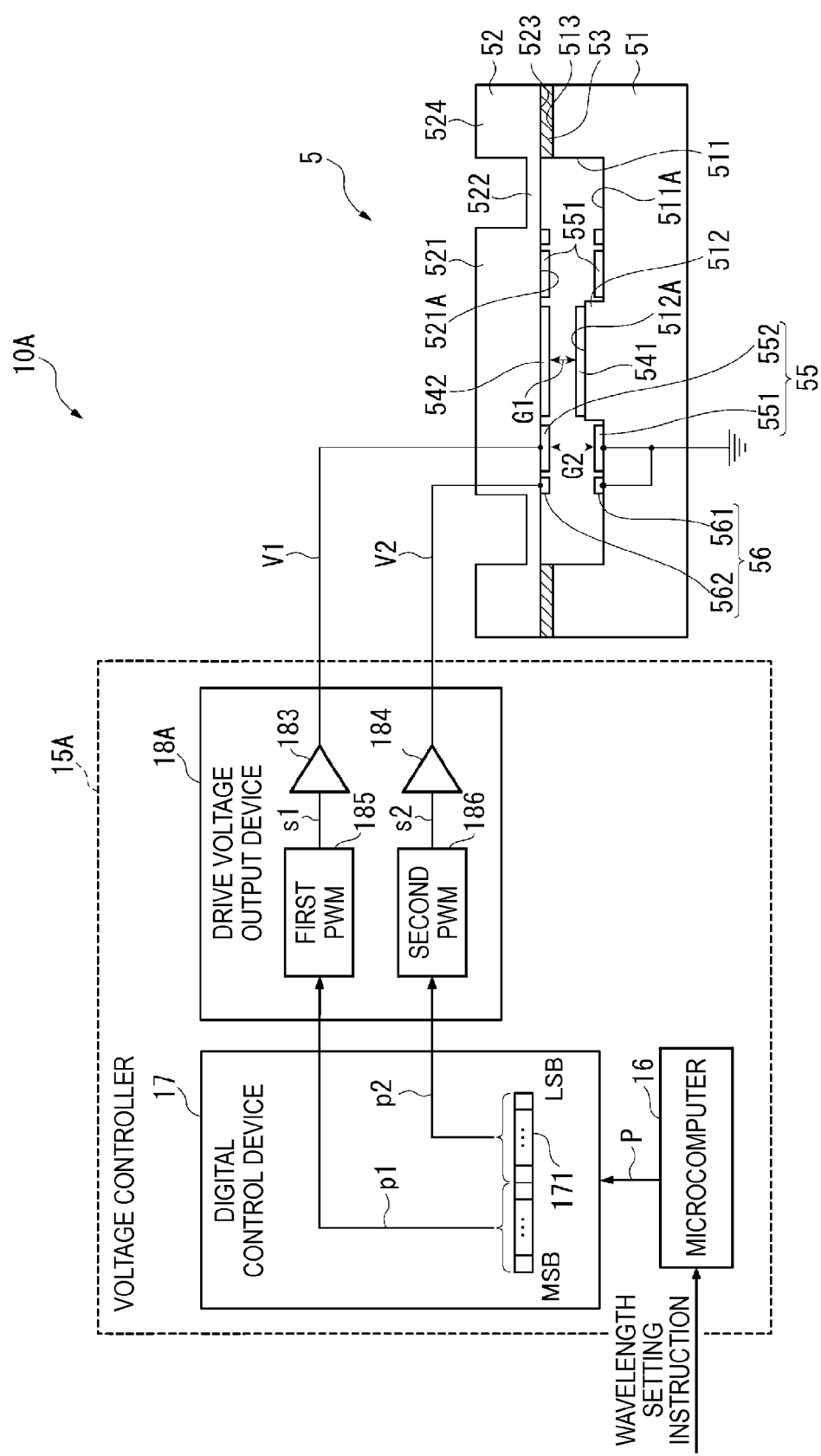
FIG. 5 shows a schematic configuration of an optical module of a second embodiment according to the invention.

FIG. 5 is a block diagram showing a schematic configuration of an optical module 10A of the second embodiment according to the invention. In the following description, the configurations having already been described have the same reference characters and descriptions thereof will be omitted or simplified.

The optical module 10A includes the wavelength tunable interference filter 5 and a voltage controller 15A, as shown in FIG. 5.

The voltage controller 15A includes the microcomputer 16, the digital control device 17, and a drive voltage output device 18A.

The drive voltage output device 18A includes a first PWM 185, a second PWM 186, and the amplifiers 183 and 184 connected to the PWMs 185 and 186 respectively.

In the present embodiment, the first PWM 185 and the second PWM 186 are configured in the same manner except that drive variables inputted thereto differ from each other.

The first PWM 185 produces a pulse wave having a duty ratio corresponding to the first individual drive variable p1 from the digital control device 17 and outputs the pulse wave as the first drive voltage signal s1 corresponding to the first drive voltage V1 to the amplifier 183. The first PWM 185 outputs the first drive voltage signal s1 having a duty ratio necessary to output the first drive voltage V1 corresponding to the value of the first individual drive variable p1. When the duty ratio is 1, the first PWM 185 outputs the first drive voltage signal s1 corresponding to the first drive voltage V1 of 15 V, as shown in FIG. 4.

The amplifier 183 amplifies the voltage value of the first drive voltage signal s1 from the first PWM 185 and applies the amplified voltage as the first drive voltage V1 to the first movable electrode 552, that is, the first electrostatic actuator 55.

The second PWM 186 produces a pulse wave having a duty ratio corresponding to the second individual drive variable p2 from the digital control device 17 and outputs the pulse wave as the second drive voltage signal s2 to the amplifier 184.

The amplifier 184 amplifies the voltage value of the second drive voltage signal s2 from the second PWM 186 and applies the amplified voltage as the second drive voltage V2 to the second movable electrode 562, that is, the second electrostatic actuator 56.

Advantageous Effects of Second Embodiment

In the present embodiment, the two PWMs 185 and 186 are used to convert the individual drive variables p1 and p2 into the drive voltage signals s1 and s2, respectively.

Using the PWMs each capable of processing an 8-bit digital signal also allows the 16-bit-equivalent precise drive control at high speed, as in the first embodiment.

Further, the number of digits of a timer circuit provided in each of the PWMs can be reduced, whereby an inexpensive PWM can be used.

Moreover, as the amplifiers that amplify the drive voltage signals s1 and s2, which are outputted from the PWMs, class-D amplifiers (digital amplifiers) can be used. A class-D amplifier has high amplification efficiency and can be compact, whereby the drive efficiency of the voltage controller 15A can be improved and the size thereof can be reduced.

Third Embodiment

A third embodiment according to the invention will next be described with reference to the drawings.

The present embodiment differs from the second embodiment in that a gap detector that detects the dimension of the inter-reflection-film gap G1 is provided and the drive voltages are controlled based on a detection result.

Figure 6:
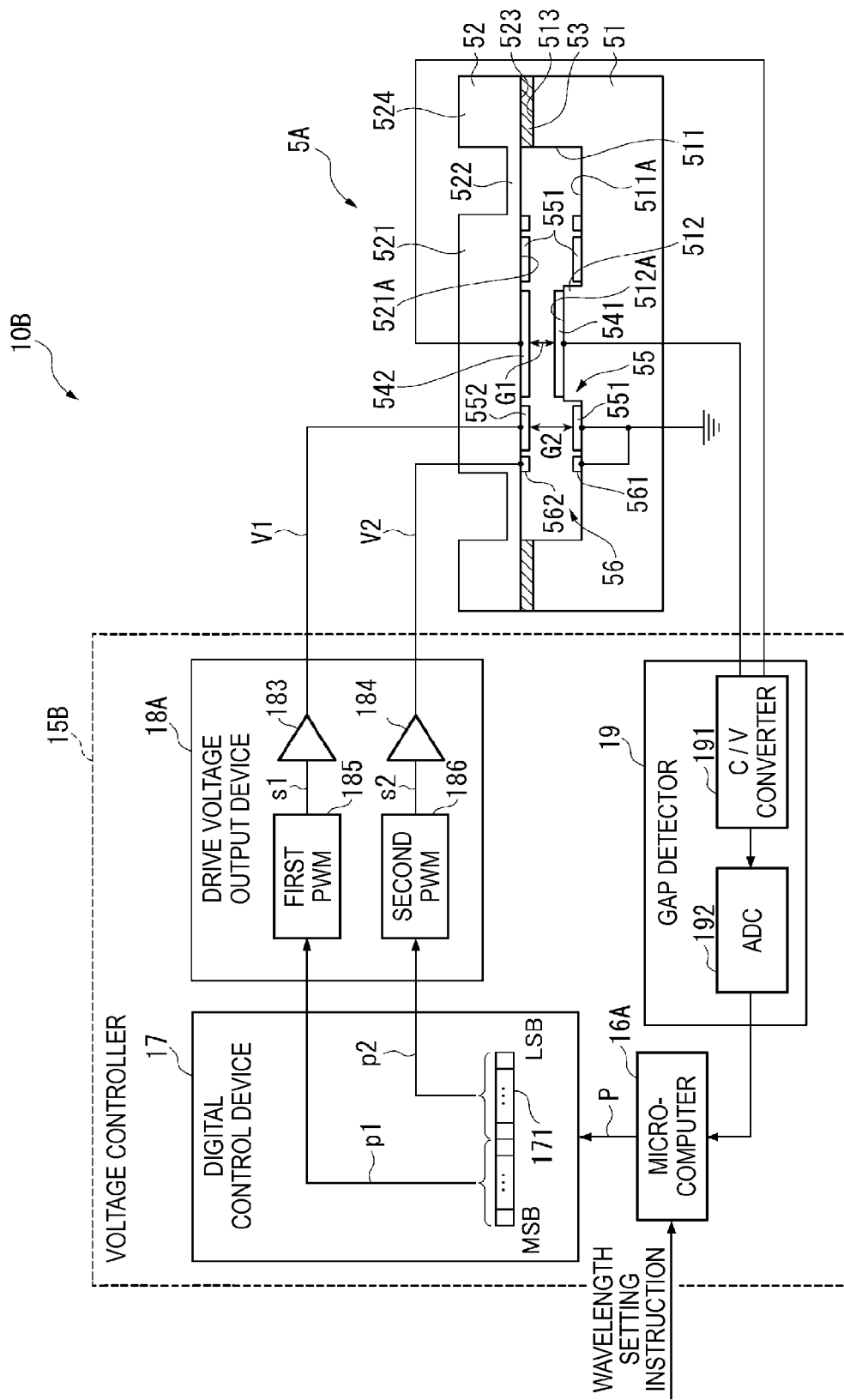
FIG. 6 shows a schematic configuration of an optical module of a third embodiment according to the invention.

FIG. 6 is a block diagram showing a schematic configuration of an optical module 10B of the third embodiment according to the invention.

The optical module 10B includes a wavelength tunable interference filter 5A and a voltage controller 15B, as shown in FIG. 6.

In the wavelength tunable interference filter 5A, the first fixed reflective film 541 and the movable reflection film 542 are used as capacitance detection electrodes for detecting electrostatic capacitance between the reflection films 541 and 542.

The wavelength tunable interference filter 5A has a drawn electrode extending from each of the fixed reflection film 541 and the movable reflection film 542, and the drawn electrode is exposed out of the outer circumference of the fixed substrate 51 or the movable substrate 52. The exposed portion of the drawn electrode is connected to a gap detection device 19, which will be described later.

The voltage controller 15B includes a microcomputer 16A, the digital control device 17, the drive voltage output device 18A, and the gap detection device 19.

The gap detection device 19 includes a C/V converter (capacitance to voltage converter) 191 and an analog to digital converter (ADC) 192.

The C/V converter 191 is connected to the reflection films 541 and 542, detects electrostatic capacitance according to the dimension of the gap G1 between the reflection films 541 and 542, converts the detected electrostatic capacitance into a voltage, and outputs the voltage to the ADC 192.

The ADC 192 converts the voltage value corresponding to the electrostatic capacitance into a digital signal and outputs the digital signal to the microcomputer 16A.

The microcomputer 16A performs feedback control based on the input value (voltage value) from the ADC 192 and the wavelength setting instruction inputted from the controller 20. An example of the feedback control includes calculation of the dimension of the inter-reflection-film gap G1 and the overall displacement amount, correction of the drive variable P based on the difference between each of the calculated values and a target value, and output of the corrected drive variable P to the digital control device 17. In addition, the microcomputer 16A may perform feedback control based, for example, on PID control.

The voltage controller 15B applies drive voltages to the electrostatic actuators 55 and 56 based on the drive variable P corrected by the microcomputer 16A.

The fixed reflection film 541, the movable reflection film 542, the microcomputer 16A, and the gap detection device 19 detect the overall displacement amount and correspond to the displacement amount detection section according to an embodiment of the invention.

Advantageous Effects of Third Embodiment

In the present embodiment, the voltage controller 15B uses a detection value corresponding to the dimension of the inter-reflection-film gap G1 to perform the drive voltage feedback control, whereby the dimension of the inter-reflection-film gap G1, that is, the overall displacement amount can be controlled in a more precise manner.

Further, the pair of reflection films 541 and 542 are used as the capacitance detection electrodes to detect the electrostatic capacitance between the pair of reflection films 541 and 542. The dimension of the inter-reflection-film gap G1 can therefore be precisely detected. Further, since the pair of reflection films 541 and 542 are used as the capacitance detection electrodes to detect the dimension of the gap G1, the size of the gap dimension detector can be reduced as compared, for example, with a configuration in which a strain gauge or any other component is used to detect the dimension of the gap G1, whereby the size of the wavelength tunable interference filter 5A and hence the size of the optical module 10B can be reduced.

Variations of Embodiments

The invention is not limited to the embodiments described above, and configurations provided, for example, by changing, improving, and appropriately combining the embodiments with each other to the extent that they can achieve the advantage of the invention fall within the scope of the invention.

For example, in each of the embodiments described above, an electrostatic actuator is presented as each of the actuators that change the inter-reflection-film gap G1 by way of example, but the actuator is not limited to an electrostatic actuator. The actuator may be an electromagnetic actuator or a piezoelectric actuator.

Figure 7:
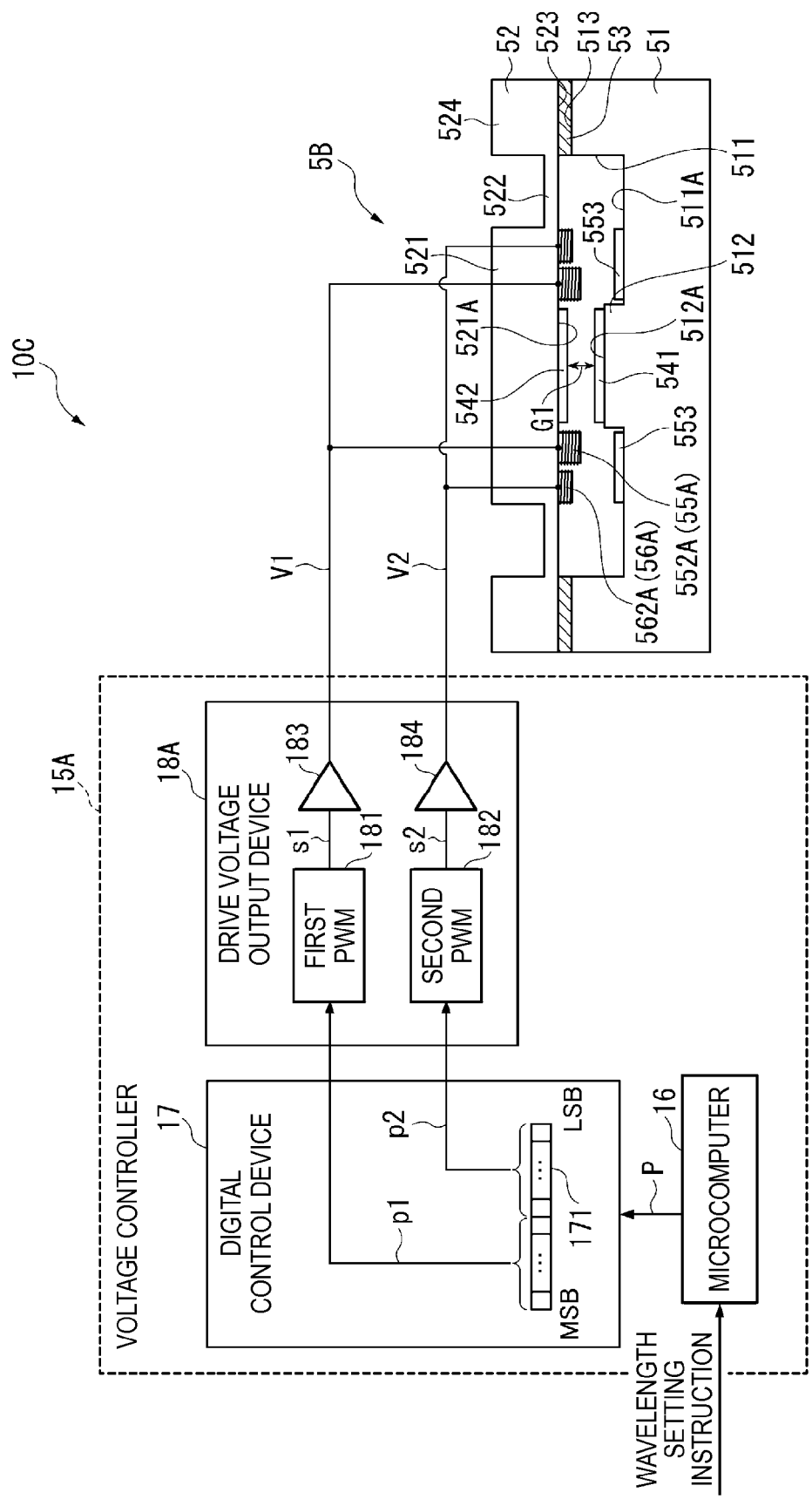
FIG. 7 shows a schematic configuration of a variation of the optical module of any of the embodiments according to the invention.

FIG. 7 shows a schematic configuration of an optical module 10C including a wavelength tunable interference filter employing electromagnetic actuators as an example of the actuators.

The optical module 10C includes a wavelength tunable interference filter 5B and the voltage controller 15A, as shown in FIG. 7.

The wavelength tunable interference filter 5B includes a first electromagnetic actuator 55A and a second electromagnetic actuator 56a as the actuators that displace the movable portion 521 toward the fixed substrate 51. In the wavelength tunable interference filter 5B, the following components in each of the embodiments described above are changed as follows: The first fixed electrode 551 and the second fixed electrode 561 are replaced with a permanent magnet 553; the first movable electrode 552 is replaced with a first induction coil 552A; and the second movable electrode 562 is replaced with a second induction coil 562A.

The first induction coil 552A is connected to the amplifier 183, and the first drive voltage V1 is applied to the first induction coil 552A. The second induction coil 562A is connected to the amplifier 184, and the second drive voltage V2 is applied to the second induction coil 562A. Each of the induction coils 552A and 562A, through which a current according to the corresponding drive voltage flows and which therefore produces a Lorentz force, is attracted toward the fixed substrate 51 to displace the movable portion 521.

In the present embodiment as in the embodiments described above, the displacement amounts are defined as follows: In the first electromagnetic actuator 55A, let $d_1$ be the displacement amount corresponding to one step of the first individual drive variable p1; in the second electromagnetic actuator 56A, let $d_2$ be the displacement amount corresponding to one step of the second individual drive variable p2 and $d_{2M}$ be the displacement amount provided when the maximum value of the second drive voltage V2 is applied; and $d_1$ is equal to or substantially equal to $d_2+d_{2M}$.

In the present embodiment, the number of turns of the coils in the electromagnetic actuators 55A and 56A are so set in accordance with the amplification factors of the amplifiers 183 and 184 that the displacement amounts satisfy the relationship described above when the drive voltages change by a certain amount and the overall displacement amount is related to the value of the drive variable P. The number of turns of the coin in the first electromagnetic actuator 55A is greater than that in the second electromagnetic actuator 56A.

FIG. 7 shows a case where the electromagnetic actuators 55A and 56A, two sets in total, are disposed on opposite sides of the movable reflection film 542, but the configuration described above is not necessarily employed. The electromagnetic actuators 55A and 56A, three or more sets in total, may be disposed around the movable reflection film 542. This configuration is preferable because providing the electromagnetic actuators 55A and 56A in positions rotationally symmetric with respect to the center of the movable reflection film 542 allows displacement of the movable portion 521 with the movable portion 521 maintained parallel to the fixed reflection film 541.

Further, when an electromagnetic actuator is used, an induction coil formed of a wire so wound that the wire seamlessly surrounds the movable reflection film 542 may be used.

Further, a piezoelectric actuator may be used as each of the actuators. In this case, for example, a lower electrode layer, a piezoelectric layer, and an upper electrode layer are stacked on the holding portion 522, and a voltage applied between the lower electrode layer and the upper electrode layer is changed as an input value, whereby the piezoelectric film can be expanded and contracted to deform the holding portion 522.

In each of the embodiments described above, the configuration in which two actuators (electrostatic actuators) are provided is presented by way of example, but the configuration is not necessarily employed. Three or more actuators may be provided. In this case, each of the actuators is provided with a drive signal generation device (such as DAC or PWM), and the drive variable is split into individual drive variables the number of which coincides with the number of actuators.

In each of the embodiments described above, among a plurality of actuators, in two actuators that provide displacement amounts closest to each other when a predetermined voltage is applied, the displacement amount $d_1$ corresponding to one step associated with the actuator that provides a larger displacement amount is equal to or substantially equal to the sum of the displacement amount $d_2$ corresponding to one step associated with the actuator that provides a smaller displacement amount and the displacement amount $d_{2M}$ provided when a maximum drive voltage for the actuator that provides the smaller displacement amount is applied thereto, but the condition described above is not necessarily satisfied.

For example, among a plurality of actuators, the relationship described above may be satisfied between at least two actuators, or the relationship described above may not be satisfied between any two of the actuators.

In each of the embodiments described above, the magnitude of the drive variable corresponds to the magnitude of the overall displacement amount, and the individual drive variables are obtained by sequentially dividing the drive variable in a direction from an upper digit toward a lower digit. Further, a plurality of individual drive variable are so related to a plurality of actuators that an actuator that provides a smaller displacement amount when a predetermined drive voltage is applied uses lower digits of the drive variable, but the configuration is not necessarily employed.

For example, the individual drive variables may instead be arbitrarily related to the actuators independently of the amounts of change in the drive amount corresponding to one step associated with the actuators, the upper and lower digits of the driver variable, or other factors. Further, the magnitude of the drive variable may not correspond to the magnitude of the overall displacement amount.

More specifically, for example, when two actuators are provided, the drive variable may be so split that the first individual drive variable has the even digits of the drive variable and the second individual drive variable has the odd digits thereof. In this case, the drive variable may be so set that it is an appropriate combination of the plurality of individual drive variables related to the plurality of actuators.

In each of the embodiments described above, in a plurality of actuators, different displacement amounts corresponding to one step of the individual drive variables are provided by providing different facing areas of the electrostatic actuators or different numbers of turns of the coils of the electromagnetic actuators, but the configuration is not necessarily employed. For example, the amounts of change in the drive voltages corresponding to one step of the individual drive variables may be allowed to differ from each other among the actuators by providing a difference in the amplification factor between the amplifiers 183 and 184 in the voltage controller.

Further, when an electrostatic actuator is used as each of the actuators, the inter-electrode gaps G2 may be allowed to differ from each other among the electrostatic actuators to cause the displacement amounts provided when drive voltages are applied to differ from each other.

In each of the embodiments described above, in a plurality of actuators, the displacement amounts corresponding to one step of the individual drive variables differ from each other, but the configuration described above is not necessarily employed. For example, among the plurality of actuators, some may provide the same displacement amount corresponding to one step of the individual drive variables or all the actuators may provide the same displacement amount.

In the third embodiment described above, the configuration in which the gap detector detects electrostatic capacitance is presented by way of example, but the configuration described above is not necessarily employed. For example, a strain gauge or any other component may be used to detect a curved state of the movable substrate 52 (holding portion 522) and hence detect the dimension of the inter-reflection-film gap G1 or the displacement amount, or an optical sensor for detecting the dimension of the inter-reflection-film gap G1 or the displacement amount may be provided in a position external to the wavelength tunable interference filter.

In each of the embodiments described above, an enclosure that accommodates the wavelength tunable interference filter may be provided. In this case, providing a vacuum state or a reduced pressure state in the enclosure can suppress degradation of the wavelength tunable interference filter and improve the control precision.

Further, in each of the embodiments described above, the wavelength tunable interference filter 5 has the configuration in which the pair of substrates 51 and 52 and the pair of reflection films 541 and 542 provided on the substrate 51 and 52 respectively by way of example, but the configuration described above is not necessarily employed. For example, the movable substrate 52 may not be provided. In this case, for example, a first reflection film, a gap spacer, and a second reflection film are formed and layered on a first surface of a substrate (fixed substrate), and the first reflection film and the second reflection film are allowed to face each other with a gap therebetween. In this configuration, the resultant spectroscopic device is formed of a single substrate and hence thinner than in the two-substrate configuration.

In each of the embodiments described above, the configuration in which the actuator drive system is used in a wavelength tunable interference filter is presented as an application example, but the configuration described above is not necessarily employed. For example, a mirror device in which a mirror is provided on a surface of the movable substrate, specifically, the surface thereof facing away from the fixed substrate and the position and inclination of the mirror is controlled by using actuators can be used.

In each of the embodiments described above, the spectroscopic measurement apparatus 1 is presented as the electronic apparatus according to an embodiment of the invention by way of example. The optical module and the electronic apparatus according to the embodiments of the invention can be used in a variety of fields as well as the example described above.

Figure 8:
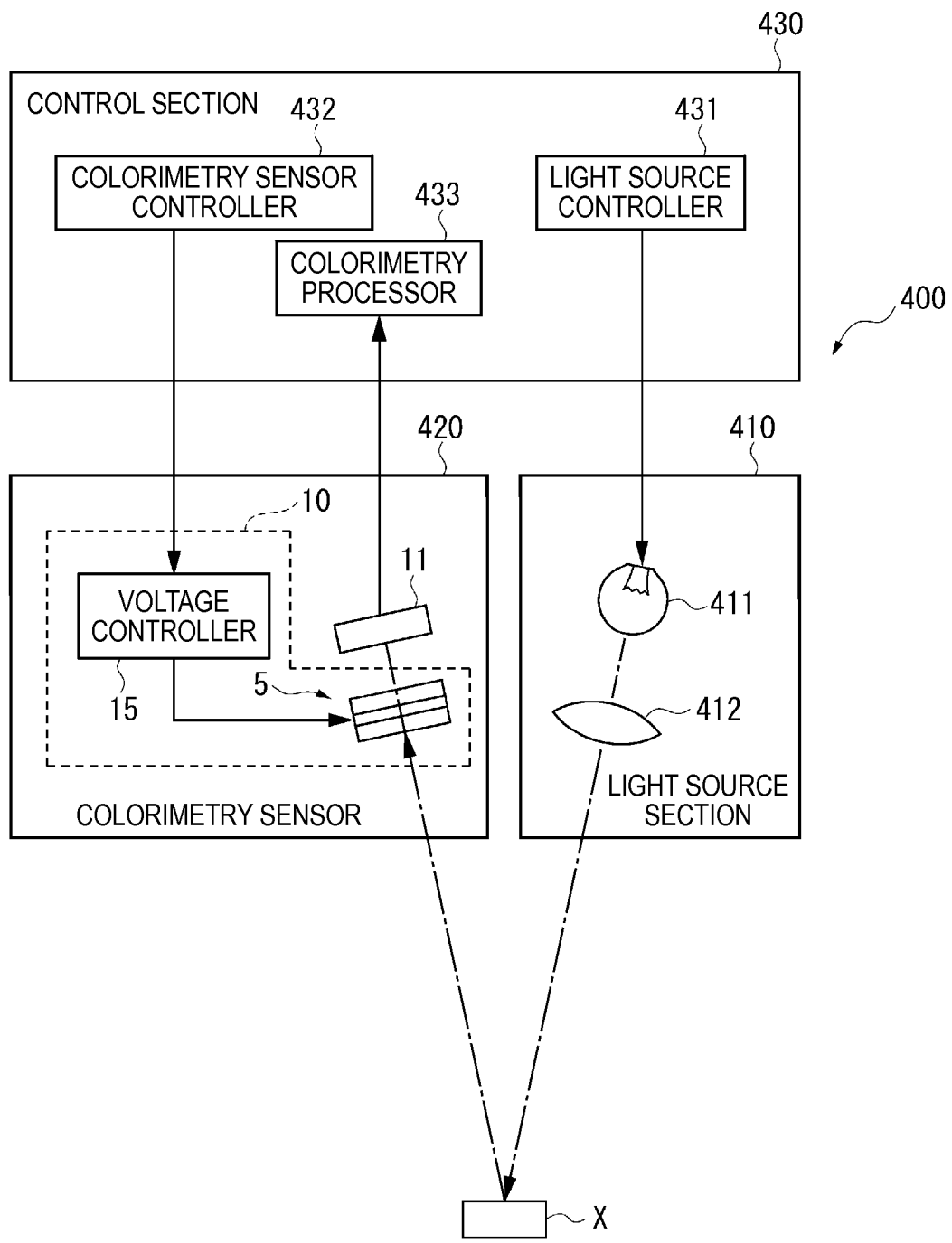
FIG. 8 shows a schematic configuration of a colorimetry apparatus that is an example of an electronic apparatus according to an embodiment of the invention.

For example, the electronic apparatus according to the embodiment of the invention can be used in a colorimetry apparatus for color measurement, as shown in FIG. 8.

FIG. 8 is a block diagram showing an example of a colorimetry apparatus 400 including a wavelength tunable interference filter.

The colorimetry apparatus 400 includes a light source section 410, which outputs light toward an object X under measurement, a colorimetry sensor 420 (optical module), and a control section 430 (control unit), which controls overall action of the colorimetry apparatus 400, as shown in FIG. 8. The colorimetry apparatus 400 operates as follows: The light outputted from the light source section 410 is reflected off the object X under measurement; the colorimetry sensor 420 receives the reflected light under measurement; and the chromaticity of the light under measurement, that is, the color of the object X under measurement is analyzed and measured based on a detection signal outputted from the colorimetry sensor 420.

The light source section 410 includes alight source 411 and a plurality of lenses 412 (FIG. 8 shows only one of them) and outputs, for example, reference light (white light, for example) toward the objet X under measurement. The plurality of lenses 412 may include a collimator lens. In this case, in the light source section 410, the collimator lens parallelizes the reference light emitted from the light source 411 and outputs the parallelized reference light through a projection lens (not shown) toward the objet X under measurement. In the present embodiment, the colorimetry apparatus 400 including the light source section 410 is presented by way of example, but the light source section 410 may not be provided, for example, when the objet X under measurement is a liquid crystal panel or any other light emitting member.

The colorimetry sensor 420 includes the wavelength tunable interference filter 5, the detector 11, which receives light having passed through the wavelength tunable interference filter 5, and the voltage controller 15, which applies a voltage according to the wavelength of light that the wavelength tunable interference filter 5 allows to transmit, as shown in FIG. 8. The wavelength tunable interference filter 5 and the voltage controller 15 form the optical module 10. The colorimetry sensor 420 further includes an optical lens for incident light (not shown) that is located in a position facing the wavelength tunable interference filter 5 and guides the reflected light reflected off the objet X under measurement (light under measurement) into the colorimetry sensor 420. In the colorimetry sensor 420, the wavelength tunable interference filter 5 separates light of a predetermined wavelength from the light under measurement incident through the optical lens for incident light, and the detector 11 receives the separated light. The optical module 10 may be replaced with any of the optical modules 10A, 10B, and 10C described above.

The control section 430 controls overall action of the colorimetry apparatus 400.

The control section 430 can, for example, be a general-purpose personal computer, a personal digital assistant, or a computer dedicated for colorimetry. The control section 430 includes a light source controller 431, a colorimetry sensor controller 432, and a colorimetry processor 433, as shown in FIG. 8.

The light source controller 431 is connected to the light source section 410 and outputs a predetermined control signal based, for example, on a user's setting input to the light source section 410 to cause it to emit white light of predetermined luminance.

The colorimetry sensor controller 432 is connected to the colorimetry sensor 420 and sets the wavelength of light to be received by the colorimetry sensor 420 based, for example, on a user's setting input and outputs a control signal to the colorimetry sensor 420 to cause it to detect the amount of light of the thus set wavelength. The voltage controller 15 in the colorimetry sensor 420 then applies a voltage to the electrostatic actuator 56 based on the control signal to drive the wavelength tunable interference filter 5.

The colorimetry processor 433 analyzes the chromaticity of the objet X under measurement based on the received amount of light detected with the detector 11.

Another example of the electronic apparatus according to the embodiment of the invention may be a light-based system for detecting presence of a specific substance. Examples of such a system may include an on-vehicle gas leakage detector that employs a spectroscopic measurement method using an optical filter device according to an embodiment of the invention, an optoacoustic rare gas detector for respiratory detection, and other gas detection apparatus.

An example of such a gas detection apparatus will be described below with reference to the drawings.

Figure 9:
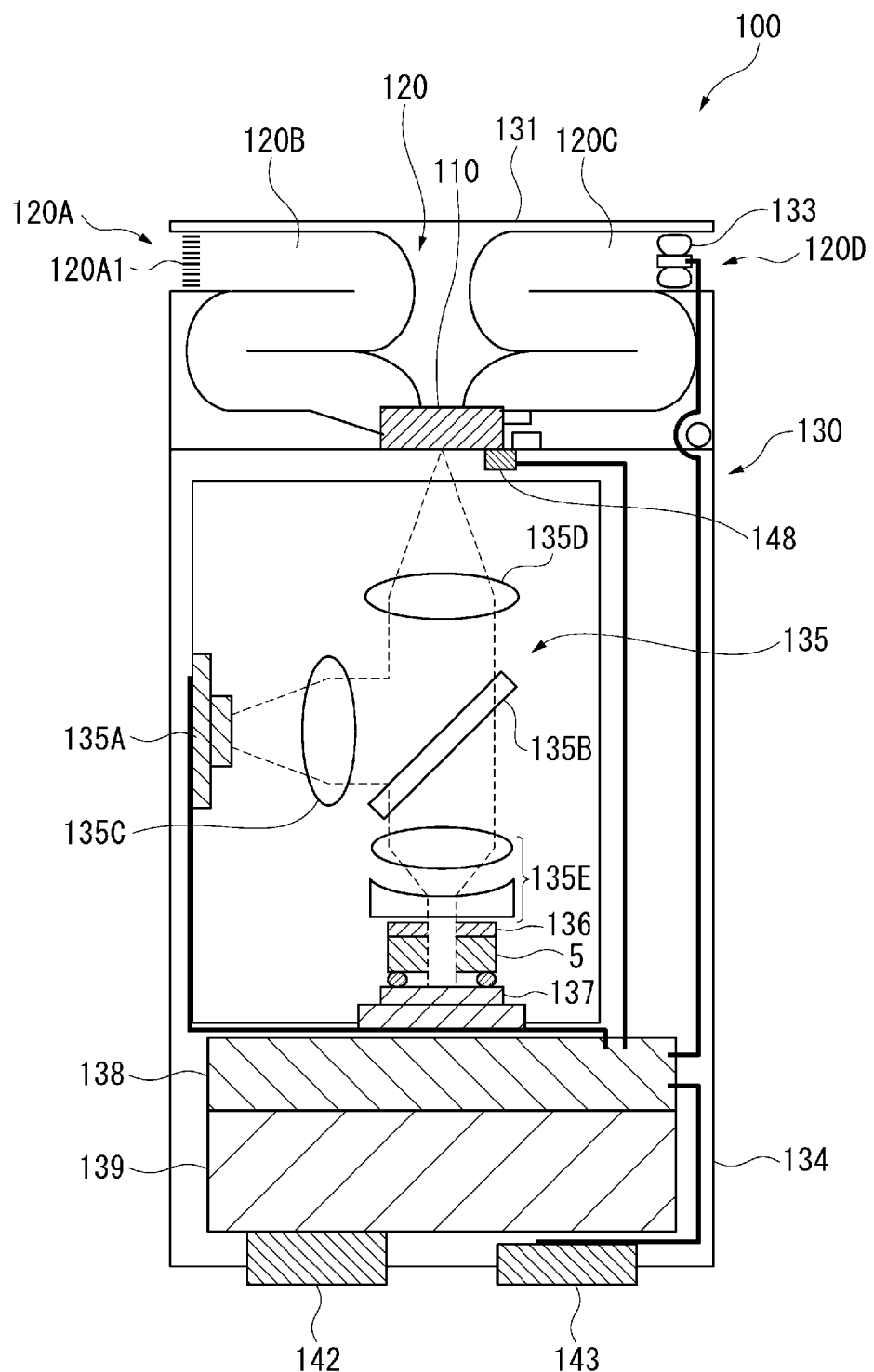
FIG. 9 shows a schematic configuration of a gas detection apparatus that is an example of an electronic apparatus according to an embodiment of the invention.

FIG. 9 is a schematic view showing an example of a gas detection apparatus including the optical filter device.

Figure 10:
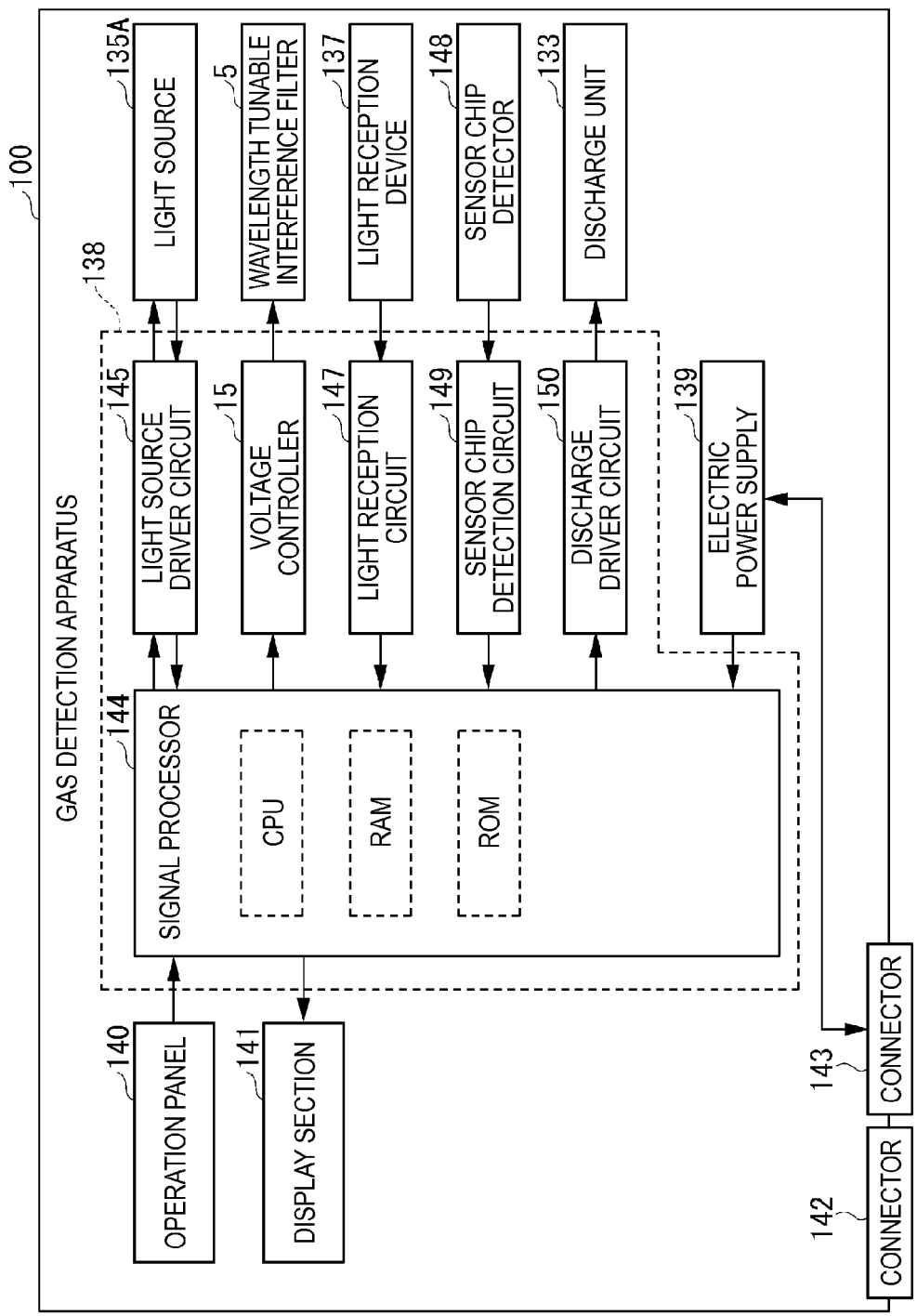
FIG. 10 is a block diagram showing a control system of the gas detection apparatus shown in FIG. 9.

FIG. 10 is a block diagram showing the configuration of a control system of the gas detection apparatus shown in FIG. 9.

A gas detection apparatus 100 includes a sensor chip 110, a channel 120 having a suction port 120A, a suction channel 120B, a discharge channel 120C, and a discharge port 120D, and a main body 130, as shown in FIG. 9.

The main body 130 includes a sensor unit cover 131 having an aperture through which the channel 120 can be attached and detached, a discharge unit 133, an enclosure 134, an optical unit 135, a filter 136, the wavelength tunable interference filter 5, a detection unit including a light reception device 137 (detector), a control unit 138, which processes a detected signal and controls the detector, and an electric power supply 139, which supplies electric power. The optical unit 135 includes a light source 135A, which emits light, a beam splitter 135B, which reflects the light incident from the light source 135A toward the sensor chip 110 whereas transmitting light incident from the sensor chip side toward the light reception device 137, and lenses 135C, 135D, and 135E.

On the exterior surface of the gas detection apparatus 100 are provided an operation panel 140, a display section 141, a connector 142 for external interfacing, and the electric power supply 139, as shown in FIG. 9. When the electric power supply 139 is a secondary battery, a connector 143 for charging purposes may be further provided.

Further, the control unit 138 in the gas detection apparatus 100 includes a signal processor 144, which is formed, for example, of a CPU, alight source driver circuit 145, which controls the light source 135A, a voltage controller 146, which controls the wavelength tunable interference filter 5, alight reception circuit 147, which receives a signal from the light reception device 137, a sensor chip detection circuit 149, which receives a signal from a sensor chip detector 148, which reads a code of the sensor chip 110 and detects whether or not the sensor chip 110 is present, and a discharge driver circuit 150, which controls the discharge unit 133, as shown in FIG. 10.

The action of the thus configured gas detection apparatus 100 will next be described.

The sensor chip detector 148 is disposed inside the sensor unit cover 131 in an upper portion of the main body 130, and the sensor chip detector 148 detects whether or not the sensor chip 110 is present. The signal processor 144, when it detects a detection signal from the sensor chip detector 148, determines that the sensor chip 110 has been attached and provides the display section 141 with a display signal that causes the display section 141 to display information representing that detection action is ready.

For example, when a user operates the operation panel 140 and the operation panel 140 outputs an instruction signal representing start of detection to the signal processor 144, the signal processor 144 first outputs a light source activation signal to the light source driver circuit 145 to activate the light source 135A. Having been driven, the light source 135A emits single-wavelength, linearly polarized, stable laser light. Further, the light source 135A has a built-in temperature sensor and light amount sensor, which output information on the temperature and the amount of light to the signal processor 144. When the signal processor 144 determines that the light source 135A is operating in a stable manner based on the temperature and the amount of light inputted from the light source 135A, the signal processor 144 controls the discharge driver circuit 150 to activate the discharge unit 133. As a result, a gaseous specimen containing a target substance to be detected (gas molecule) is guided through the suction port 120A through the suction channel 120B, the sensor chip 110, and the discharge channel 120C to the discharge port 120D. The suction port 120A is provided with a dust removal filter 120A1, which removes relatively large dust, part of water vapor, and other substances.

The sensor chip 110 is a sensor that has a plurality of metal nano-structures incorporated therein and operates based on localized surface plasmon resonance. In the thus configured sensor chip 110, the laser light incident thereon forms an enhanced electric field among the metal nano-structures. When a gas molecule enters the enhanced electric field, Raman scattered light carrying information on molecular vibration and Rayleigh scattered light are produced.

The Rayleigh scattered light and the Raman scattered light are incident through the optical unit 135 on the filter 136, which separates the Rayleigh scattered light out, and the Raman scattered light is incident on the wavelength tunable interference filter 5. The signal processor 144 then controls the voltage controller 146, adjusts the voltage applied to the wavelength tunable interference filter 5 to cause the wavelength tunable interference filter 5 to separate Raman scattered light corresponding to the gas molecule under detection. Thereafter, having received the separated light, the light reception device 137 outputs a light reception signal according to the amount of received light to the signal processor 144 via the light reception circuit 147.

The signal processor 144 compares data on the spectrum of the thus obtained Raman scattered light corresponding to the gas molecule under detection with data stored in a ROM and determines whether or not the detected gas molecule is the target gas molecule to identify the substance. The signal processor 144 further displays information on the result of the identification on the display section 141 and outputs the information via the connector 142 to an external apparatus.

In FIGS. 9 and 10 described above, the gas detection apparatus 100, which performs gas detection based on Raman scattered light separated from initial Raman scattered light by the wavelength tunable interference filter 5, is presented byway of example, but a gas detection apparatus that identifies the type of gas by detecting the absorbance specific to the gas may instead be provided. In this case, a gas sensor that receives a gas flowing therein, separates light absorbed by the gas from incident light, and detects the separated light is used as the optical module according to any of the embodiments of the invention. A gas detection apparatus that includes the gas sensor and analyzes and identifies a gas that flows into the sensor can be an electronic apparatus according to an embodiment of the invention. The configuration described above also allows gas component detection by using the optical filer device.

The system for detecting presence of a specific substance is not limited to the gas detection system described above. Another system for detecting presence of a specific substance can, for example, be a substance composition analyzer, such as a noninvasive measurement apparatus for measuring sugars based on near-infrared spectroscopy and a noninvasive measurement apparatus for acquiring information on food, biological body, mineral, and other substances.

A food analyzer will be described below as an example of the substance composition analyzer described above.

Figure 11:
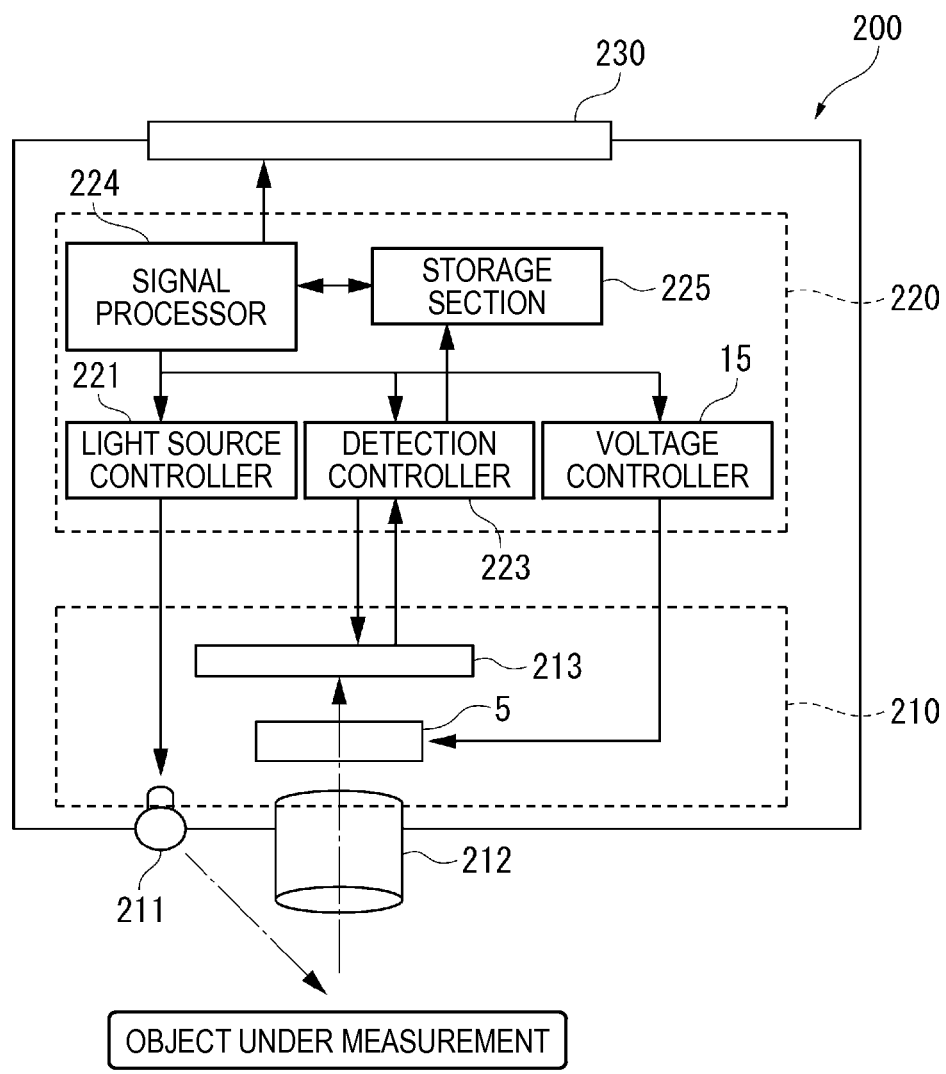
FIG. 11 shows a schematic configuration of a food analyzer that is an example of an electronic apparatus according to an embodiment of the invention.

FIG. 11 shows a schematic configuration of a food analyzer that is an example of an electronic apparatus using the wavelength tunable interference filter 5.

A food analyzer 200 includes a detection unit 210 (optical module), a control unit 220, and a display unit 230, as shown in FIG. 11. The detection unit 210 includes a light source 211, which emits light, an imaging lens 212, which introduces light from an object under measurement, the wavelength tunable interference filter 5, which separates desired light from the light introduced through the imaging lens 212, and an imager 213 (detector), which detects the separated light.

The control unit 220 includes a light source controller 221, which performs light-on/off control on the light source 211 and luminance control thereon when the light source 211 is emitting light, a voltage controller 222, which controls the wavelength tunable interference filter 5, a detection controller 223, which controls the imager 213 and acquires a spectroscopic image captured with the imager 213, a signal processor 224, and a storage section 225.

In the food analyzer 200, when the system thereof is driven, the light source controller 221 controls the light source 211 to cause it to emit light toward an object under measurement. Light reflected off the object under measurement then passes through the imaging lens 212 and enters the wavelength tunable interference filter 5. A voltage that allows the wavelength tunable interference filter 5 to separate light of a desired wavelength is applied thereto under the control of the voltage controller 222, and the separated light is captured as an image with the imager 213 formed, for example, of a CCD camera. The captured image light is accumulated as a spectroscopic image in the storage section 225. The signal processor 224 controls the voltage controller 222 to change the value of the voltage applied to the wavelength tunable interference filter 5 to acquire spectroscopic images of a variety of wavelengths.

The signal processor 224 then computes data from the pixels of each of the images accumulated in the storage section 225 to determine a spectrum at each of the pixels. The storage section 225 has further stored, for example, information on the relationship between food components and spectra, and the signal processor 224 analyzes data on the obtained spectra based on the information on food stored in the storage section 225 to determine food components contained in the object under detection and the contents of the food components. Further, the calorie, the degree of freshness, and other factors of the food can be calculated based on the resultant food components and contents thereof. Moreover, the spectral distribution in each image can be analyzed, for example, to extract a portion of the food under inspection where freshness has lowered and even detect foreign matter and other undesirable objects contained in the food.

The signal processor 224 then causes the display unit 230 to display information on the thus obtained components, contents, calorie, freshness, and other factors of the food under inspection.

In addition to the example of the food analyzer 200 shown FIG. 11, substantially the same configuration can be used as noninvasive measurement apparatus described above that measure other types of information. For example, a bioanalyzer that analyzes biological components, for example, measures and analyzes blood or other bodily fluid components, can be provided. A bioanalyzer of this type, for example, an apparatus that measures blood and other bodily fluid components, can be an apparatus that senses ethyl alcohol, which can be used as a drunk-driving prevention apparatus that detects the state of a drunk driver. Further, an electronic endoscope system including a bioanalyzer of this type can be provided.

Moreover, a mineral analyzer that analyzes mineral components can be provided.

Further, the interference filter, the optical module, and the electronic apparatus according to the embodiments of the invention can be used in the following apparatus.

For example, changing the intensity of light of a variety of wavelengths over time allows the light of the variety of wavelengths to transmit data. In this case, in the optical module including the interference filter according to any of the embodiments of the invention, the interference filter separates light of a specific wavelength and a light receiver receives the light for extraction of the data transmitted by the light of the specific wavelength. An electronic apparatus including the data extraction optical module can process the data carried by the light of the variety of wavelengths for optical communication.

Other electronic apparatus that includes the interference filter provided in the optical filter device according to any of the embodiments of the invention and separates light can be a spectroscopic camera that captures a spectroscopic image, a spectroscopic analyzer, and other apparatus. An example of a spectroscopic camera of this type may include an infrared with a built-in wavelength tunable interference filter.

Figure 12:
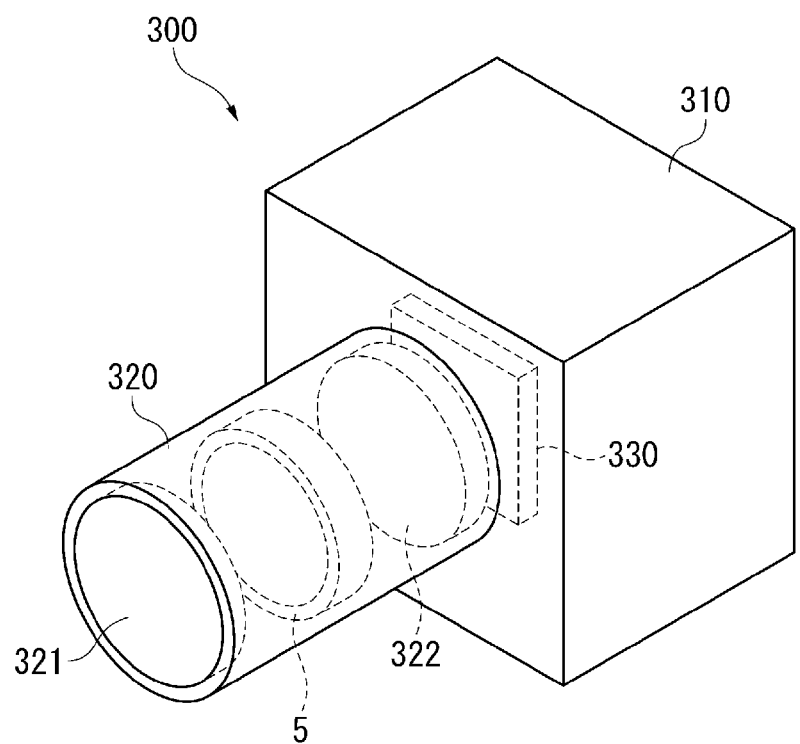
FIG. 12 shows a schematic configuration of a spectroscopic camera that is an example of an electronic apparatus according to an embodiment of the invention.

FIG. 12 is a diagrammatic view showing a schematic configuration of a spectroscopic camera. A spectroscopic camera 300 includes a camera body 310, an imaging lens unit 320, and an imager 330 (detector), as shown in FIG. 12.

The camera body 310 is a portion grasped and operated by a user.

The imaging lens unit 320 is attached to the camera body 310 and guides incident image light to the imager 330. The imaging lens unit 320 includes an objective lens 321, an image forming lens 322, and the wavelength tunable interference filter 5 disposed between the two lenses, as shown in FIG. 12.

The imager 330 is formed of a light reception device and captures the image light guided through the imaging lens unit 320.

The thus configured spectroscopic camera 300, in which the wavelength tunable interference filter 5 transmits light of a wavelength to be captured as an image, can capture a spectroscopic image formed by light of a desired wavelength.

Further, the optical filter device including the interference filter according to any of the embodiments of the invention may be used as a bandpass filter. For example, the optical filter device can be used as an optical laser apparatus in which the interference filter receives light within a predetermined wavelength region emitted from a light emitting device, separates only narrow-band light around a predetermined wavelength, and transmits the separated light.

Moreover, the optical filter device including the interference filter according to any of the embodiments of the invention may be used in a biometrics authentication apparatus. For example, the optical filter device can also be used in an authentication apparatus based on blood vessels, fingerprints, retina, iris, or any other body part by using near-infrared light or visible light.

Further, the optical module and the electronic apparatus according to the embodiments of the invention can be used as a concentration detection apparatus. In this case, the interference filter separates infrared energy (infrared light) radiated from an object, and the energy is analyzed for measurement of the concentration of a subject in a sample.

As described above, the interference filter, the optical module, and the electronic apparatus according to the embodiments of the invention can be used in any apparatus that separates predetermined light from incident light. Since the optical filter device including the interference filter according to any of the embodiments of the invention can by itself separate light of a plurality of wavelengths from incident light as described above, spectral measurement based on the plurality of wavelengths and detection of a plurality of components can be performed with precision. Therefore, each of the optical module and the electronic apparatus has a size further smaller than the size of an apparatus of related art that extracts light of desired wavelengths by using a plurality of devices and can, for example, be preferably used as a portable or on-vehicle optical device.

In addition, each of the specific structures according to the embodiments of the invention may be an appropriate combination of the embodiments and the variations described above or may be changed as appropriate to any other structure in actual implementation of the invention to the extent that the advantage of the invention is achieved.

The entire disclosure of Japanese Patent Application No. 2013-201046 filed on Sep. 27, 2013 is expressly incorporated by reference herein.

What is claimed is:

1. An actuator drive system comprising:
a plurality of electrostatic actuators that are driven by applying drive voltages so as to provide displacement amounts of a first gap between displacement members of the plurality of electrostatic actuators, the drive voltages having first and second drive voltages, the plurality of electrostatic actuators having:
　a first electrostatic actuator that is configured with first and second electrodes which are spaced apart each other with a second gap; and
　a second electrostatic actuator that is configured with third and fourth electrodes which are spaced apart from each other with the second gap; and
a voltage controller that is configured to apply the first and second drive voltages to pairs of the first and second electrodes and the third and fourth electrodes of the first and second electrostatic actuators so that the first gap is changed based on the first and second drive voltages,
wherein the voltage controller includes:
　a variable splitter that splits a drive variable corresponding to the drive voltages and having a plurality of digits into individual drive variables having at least one digit, the individual drive variables corresponding to the first and second drive voltages driving the first and second electrostatic actuators; and
　a signal generator which generates first and second drive voltage signals respectively corresponding to the first and second drive voltages based on the individual drive variables,
a first cross section of a first overlap area of the first and second electrodes in is different from a second cross section of a second overlap area of the third and fourth electrodes,
wherein the individual drive variables are configured with a first individual drive variable and a second individual drive variable, the first individual drive variable corresponds to an upper-half-digit of a full-digit of the drive variable, and the second individual drive variable corresponds to a lower-half-digit of the full-digit of the drive variable,
one of the first and second electrostatic actuators, which provides a smallest displacement amount of the first gap, corresponds to the second individual drive variable,
wherein each of the individual drive variables is configured as a plurality of bits,
the drive voltages have a minimum drive voltage value, a medium drive voltage value, and a maximum drive voltage value,
the first electrostatic actuator of the plurality of electrostatic actuators is configured to provide a first displacement amount corresponding to one of the plurality of bits of each of the individual drive variables,
the second electrostatic actuator of the plurality of electrostatic actuators is configured to provide a second displacement amount corresponding to one of the plurality of bits of each of the individual drive variables,
the second electrostatic actuator is configured to provide a third displacement amount when the voltage controller applies the maximum drive voltage to the second actuator, and
the first displacement amount is equal to or substantially equal to a sum of the second and third displacement amounts.

2. The actuator drive system according to claim 1,
wherein each of the plurality of electrostatic actuators provides one of the displacement amounts which has different values to each other when each of the plurality of electrostatic actuators is driven by one of the drive voltages.

3. The actuator drive system according to claim 2,
wherein the drive voltages have a plurality of voltage values that are different from each other,
each of the individual drive variables is configured as a plurality of bits, and
each of differences between the plurality of voltage values per one bit of the plurality of bits of each of the individual drive variables has a same value.

4. The actuator drive system according to claim 1,
wherein the signal generator is a digital-analog converter.

5. The actuator drive system according to claim 1,
wherein the signal generator is a pulse width modulator that performs pulse width modulation on a fixed voltage to generate the drive voltage signals.

6. The actuator drive system according to claim 1,
further comprising a displacement amount detector that detects a sum of the displacement amounts,
wherein the voltage controller is configured to control the drive voltages based on a detection result of the sum of the displacement amounts from the displacement amount detector.

7. The actuator drive system according to claim 6,
wherein the displacement amount detector includes a pair of capacitance detection electrodes facing each other and detects electrostatic capacitance between the capacitance detection electrodes.

8. An optical module comprising:
a pair of reflection films facing each other so as to be spaced apart each other with a first gap;
a plurality of electrostatic actuators that are driven by applying drive voltages so as to provide displacement amounts and to change a dimension of the first gap between the pair of reflection films, the drive voltages having first and second drive voltages, the plurality of electrostatic actuators having:
- a first electrostatic actuator that is configured with first and second electrodes which are spaced apart from each other with a second gap; and
- a second electrostatic actuator that is configured with third and fourth electrodes which are spaced apart each other with the second gap; and a voltage controller that is configured to apply the first and second drive voltages to pairs of the first and second electrodes and the third and fourth electrodes of the first and second electrostatic actuators so that the first gap is changed based on the first and second voltages, wherein the voltage controller includes:
- a variable splitter that splits a drive variable corresponding to the drive voltages and having a plurality of digits into individual drive variables having at least one digit, the individual drive variables corresponding to the first and second voltages driving the first and second electrostatic actuators; and
- a signal generator which generates first and second drive voltage signals respectively corresponding to the first and second drive voltages based on the individual drive variables, a first cross section of a first overlap area of the first and second electrodes is different from a second cross section of a second overlap area of the third and fourth electrodes, wherein the individual drive variables are configured with a first individual drive variable and a second individual drive variable, the first individual drive variable corresponds to an upper-half-digit of a full-digit of the drive variable, and the second individual drive variable corresponds to a lower-half-digit of the full-digit of the drive variable, one of the first and second electrostatic actuators, which provides a smallest displacement amount of the first gap, corresponds to the second individual drive variable, wherein each of the individual drive variables is configured as a plurality of bits, the drive voltages have a minimum drive voltage value, a medium drive voltage value, and a maximum drive voltage value, the first electrostatic actuator of the plurality of electrostatic actuators is configured to provide a first displacement amount corresponding to one of the plurality of bits of each of the individual drive variables, the second electrostatic actuator of the plurality of electrostatic actuators is configured to provide a second displacement amount corresponding to one of the plurality of bits of each of the individual drive variables, the second electrostatic actuator is configured to provide a third displacement amount when the voltage controller applies the maximum drive voltage to the second actuator, and the first displacement amount is equal to or substantially equal to a sum of the second and third displacement amounts.

9. An electronic apparatus comprising the optical module according to claim 8.

10. An optical module comprising:
reflection films facing each other with a first gap therebetween;
- a first electrostatic actuator that is configured with first and second electrodes which are spaced apart each other with a second gap and that is configured to be driven stepwise by a first drive voltage to provide a first displacement amount to change a dimension of the first gap;
- a second electrostatic actuator that is configured with third and fourth electrodes which are spaced apart each from other with the second gap and that is configured to be driven stepwise by a second drive voltage to provide a second displacement amount to change the dimension of the first gap; and
- a voltage controller that is configured to apply the first and second drive voltages to pairs of the first and second electrodes and the third and fourth electrodes of the first and second electrostatic actuators so that the first gap is changed based on the first and second drive voltages, the voltage controller having a variable splitter that splits a drive variable corresponding to the first and second drive voltages and having a plurality of digits into individual drive variables having at least one digit, the individual drive variables corresponding to the first and second drive voltages driving the first and second electrostatic actuators, wherein a first cross section of a first overlap area of the first and second electrodes is different from a second cross section of a second overlap area of the third and fourth electrodes, wherein the first drive voltage has a plurality of first voltage values including a first minimum value and a first maximum value, and the second drive voltage has a plurality of second voltage values including a second minimum value, a second medium value and a second maximum value, the drive variable is configured with a plurality of drive variable groups, and each of the plurality of drive variable groups has some values of the drive variable, while the voltage controller selects a first group of the plurality of drive variable groups, the voltage controller is configured to apply the first drive voltage having the first minimum value to the first actuator and is configured to apply the second drive voltage which stepwisely changes in order of the second minimum value, the second medium value and the second maximum value to the second actuator, wherein each of the individual drive variables is configured as a plurality of bits, the first electrostatic actuator is configured to provide the first displacement amount corresponding to one of the plurality of bits of each of the individual drive variables, the second electrostatic actuator is configured to provide the second displacement amount corresponding to one of the plurality of bits of each of the individual drive variable, the second electrostatic actuator is configured to provide a third displacement amount when the voltage controller applies the second drive voltage corresponding to the second maximum value to the second actuator, and the first displacement amount is equal to or substantially equal to a sum of the second and third displacement amounts.

11. An electronic apparatus comprising the optical module according to claim 10.

* * * * *